US012751120B2

(12) United States Patent
Kim et al.

(10) Patent No.: US 12,751,120 B2
(45) Date of Patent: Sep. 29, 2026

(54) DISPLAY DEVICE HAVING ALIGMENT LINE

(71) Applicant: Samsung Display Co., LTD., Yongin-si (KR)

(72) Inventors: In Woo Kim, Yongin-si (KR); Yong Tae Cho, Yongin-si (KR); Kook Hyun Choi, Yongin-si (KR); Chang Woo Kwon, Yongin-si (KR); Dae Cheol Kim, Yongin-si (KR); Jong Hwan Park, Yongin-si (KR); Ji Hyeon Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 733 days.

(21) Appl. No.: 18/116,513

(22) Filed: Mar. 2, 2023

(65) Prior Publication Data

US 2024/0038952 A1 Feb. 1, 2024

(30) Foreign Application Priority Data

Jul. 28, 2022 (KR) ........................ 10-2022-0093787

(51) Int. Cl.
*H10H 20/857* (2025.01)

(52) U.S. Cl.
CPC ................................. *H10H 20/857* (2025.01)

(58) Field of Classification Search
CPC . H10H 29/30–49; H10H 29/832–8325; H10K 59/10–38; H10K 59/805–80524
See application file for complete search history.

(56) References Cited

U.S. PATENT DOCUMENTS

| | | | | |
|---|---|---|---|---|
| 6,953,951 | B2 | 10/2005 | Yamazaki et al. | |
| 6,992,439 | B2 | 1/2006 | Yamazaki et al. | |
| 11,651,734 | B2 | 5/2023 | Jung | |
| 12,094,418 | B2 | 9/2024 | Jung | |
| 12,127,452 | B2 | 10/2024 | Kim et al. | |
| 2008/0203391 | A1 | 8/2008 | Kim et al. | |
| 2008/0204618 | A1 | 8/2008 | Jung et al. | |
| 2016/0240605 | A1 | 8/2016 | Lee et al. | |
| 2020/0365676 | A1* | 11/2020 | Lim | H10K 59/1201 |

(Continued)

FOREIGN PATENT DOCUMENTS

| | | |
|---|---|---|
| KR | 10-2017-0095809 | 8/2017 |
| KR | 10-2017-0096646 | 8/2017 |

(Continued)

*Primary Examiner* — Kevin Parendo
(74) *Attorney, Agent, or Firm* — Womble Bond Dickinson (US) LLP

(57) ABSTRACT

A display device comprises a thin film transistor layer comprising a first metal layer disposed on a substrate and a thin film transistor disposed on the first metal layer, first and second electrodes disposed in a display area on the thin film transistor layer and extending in parallel in a direction, a plurality of light emitting elements disposed between the first and second electrodes, and an alignment line disposed in a non-display area disposed adjacent to the display area and electrically connected to the first and second electrodes. The alignment line comprises metal patterns disposed in the first metal layer and spaced apart from each other, and a bridge portion disposed on the first metal layer and electrically connected to the metal patterns.

17 Claims, 28 Drawing Sheets

(56) References Cited

U.S. PATENT DOCUMENTS

| | | | | |
|---|---|---|---|---|
| 2021/0159250 | A1* | 5/2021 | Chang .................. | G09G 3/3233 |
| 2021/0202656 | A1 | 7/2021 | Ka et al. | |
| 2022/0157914 | A1* | 5/2022 | Kim ..................... | G09G 3/3233 |

FOREIGN PATENT DOCUMENTS

| | | | |
|---|---|---|---|
| KR | 10-2021-0005446 | | 1/2021 |
| KR | 10-2021-0081506 | | 7/2021 |
| KR | 10-2021-0124564 | | 10/2021 |
| KR | 10-2022-0067564 | A | 2/2022 |
| KR | 10-2022-0095400 | A | 7/2022 |

* cited by examiner

MTL1: VDL, CPE2, VIL, DL1
ACTL: DE1, ACT1, SE1, SE2, ACT2, DE2
MTL2: GE1, CPE1, GE2
MTL3: BE1, BE2, BE4

DISPLAY DEVICE HAVING ALIGMENT LINE

CROSS-REFERENCE TO RELATED APPLICATION

This application claims priority from Korean Patent Application No. 10-2022-0093787 filed on Jul. 28, 2022, in the Korean Intellectual Property Office (KIPO), and all the benefits accruing therefrom under 35 U.S.C. § 119, the contents of which in its entirety are herein incorporated by reference.

BACKGROUND

1. Technical Field

The disclosure relates to a display device and a method of manufacturing the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image can be displayed without a separate light emitting device providing light to the display panel (e.g., a “backlight unit”). The light emitting element may be an organic light emitting diode using an organic material as a fluorescent material and an inorganic light emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of blocking or preventing corrosion of an alignment line even in case that undercut of a metal pattern occurs at the edge of a display panel, and also provide a method of manufacturing the same.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device comprises a thin film transistor layer comprising a first metal layer disposed on a substrate and a thin film transistor disposed on the first metal layer, first and second electrodes disposed in a display area on the thin film transistor layer and extending in parallel in a direction, a plurality of light emitting elements disposed between the first and second electrodes, and an alignment line disposed in a non-display area disposed adjacent to the display area and electrically connected to the first and second electrodes. The alignment line comprises metal patterns disposed in the first metal layer and spaced apart from each other, and a bridge portion disposed on the first metal layer and electrically connected to the metal patterns.

The thin film transistor layer may comprise an active layer on which an active region, a drain electrode, and a source electrode of the thin film transistor are disposed, a second metal layer on which a gate electrode of the thin film transistor is disposed, and a third metal layer disposed on the second metal layer. The first and second electrodes may be disposed in a fourth metal layer on the thin film transistor layer.

The bridge portion and the fourth metal layer may be formed of a same material on a same.

The bridge portion the metal patterns spaced apart from each other may be insulated based on etching of the bridge portion.

The bridge portion may electrically connect the metal patterns spaced apart from each other.

The metal patterns may include an undercut formed at an edge of the substrate.

The metal patterns may be exposed from a side of the substrate.

The display device may further comprise an insulating layer disposed on the alignment line. The insulating layer may cover top surfaces and side surfaces of the metal patterns at an edge of the substrate.

The display device may further comprise a buffer layer covering the first metal layer, a gate insulating layer covering the active layer, an interlayer insulating layer covering the second metal layer, and a passivation layer covering the third metal layer. The bridge portion may be disposed in a bridge contact hole, the bridge contact hole may penetrate the passivation layer, the interlayer insulating layer, the gate insulating layer, and the buffer layer, and the bridge contact hole may cause the bridge portion and the metal patterns to be electrically connected to each other.

The bridge portion and the third metal layer may be formed of a same material on a same layer.

The display device may further comprise a buffer layer covering the first metal layer, a gate insulating layer covering the active layer, and an interlayer insulating layer covering the second metal layer. The bridge portion may be disposed in a bridge contact hole, the bridge contact hole may penetrate the interlayer insulating layer, the gate insulating layer, and the buffer layer, and the bridge contact hole may cause the bridge portion and the metal patterns to be electrically connected to each other.

The bridge portion and the second metal layer may be formed of a same material on a same layer.

The display device may further comprise a buffer layer covering the first metal layer, and a gate insulating layer covering the active layer. The bridge portion may be disposed in a bridge contact hole, the bridge contact hole may penetrate the gate insulating layer and the buffer layer, and the bridge contact hole may cause the bridge portion and the metal patterns to be electrically connected to each other.

The display device may further comprise a first contact electrode disposed in a fifth metal layer on the fourth metal layer and electrically connected between the first electrode and the plurality of light emitting elements, and a second contact electrode disposed in the fifth metal layer and electrically connected between the second electrode and the plurality of light emitting elements.

According to an embodiment of the disclosure, a display device comprises a first metal layer disposed on a substrate, a thin film transistor disposed on the first metal layer, an active layer on which an active region, a drain electrode, and a source electrode of the thin film transistor are disposed, a second metal layer on which a gate electrode of the thin film transistor is disposed, a third metal layer disposed on the second metal layer, a fourth metal layer disposed in a display area on the third metal layer and comprising first and second electrodes extending in parallel in a direction, a plurality of light emitting elements disposed between the first and second electrodes, and an alignment line disposed in a non-display area disposed adjacent to the display area and electrically connected to the first and second electrodes. The alignment line comprises a metal pattern disposed on the first metal layer, a first bridge portion disposed in the third metal layer and electrically connected to the metal pattern, and a second bridge portion disposed in the fourth metal layer and electrically connected to the first bridge portion.

The display device may further comprise a buffer layer covering the first metal layer, a gate insulating layer covering the active layer, an interlayer insulating layer covering the second metal layer, and a passivation layer covering the third metal layer. The first bridge portion may be disposed in a bridge contact hole, the bridge contact hole may penetrate the interlayer insulating layer, the gate insulating layer, and the buffer layer, and the bridge contact hole may cause the first bridge portion and the metal pattern to be electrically connected to each other.

The second bridge portion may be disposed in a bridge contact hole, the bridge contact hole may penetrate the passivation layer, and the bridge contact hole may cause the second bridge portion and the first bridge portion to be electrically connected to each other.

According to an embodiment of the disclosure, a method of manufacturing a display device comprises forming a first metal layer comprising metal patterns spaced apart from each other on a substrate, forming an active layer comprising an active region, a drain electrode, and a source electrode of a thin film transistor on the first metal layer, forming a second metal layer comprising a gate electrode of the thin film transistor on the active layer, forming a third metal layer on the second metal layer, forming a fourth metal layer comprising first and second electrodes extending in parallel in a direction in a display area on the third metal layer, forming a bridge portion such that the bridge portion and the fourth metal layer are disposed on a same layer in a non-display area disposed adjacent to the display area and the bridge portion electrically connects the metal patterns, aligning a plurality of light emitting elements on the first and second electrodes based on supplying an alignment signal to the first and second electrodes through the metal patterns and the bridge portion, etching the metal pattern in the non-display area using a laser etching process, and cutting an edge of the substrate using a scribing process.

The method may further comprise, after the aligning of the plurality of light emitting elements, cutting the bridge portion.

The cutting of the bridge portion may comprise separating the first and second electrodes on a row basis.

In the display device and the manufacturing method thereof according to embodiments, since there is included a bridge portion that is constructed and arranged to electrically connect metal patterns in the alignment process of light emitting elements and is etched after the completion of the alignment process of the light emitting elements, corrosion of an alignment line can be blocked or prevented even if undercut of the metal patterns occurs at the edge of a display panel.

In the display device and the manufacturing method thereof according to the embodiments, since there is included a bridge portion that is constructed and arranged to electrically connect metal patterns through a contact structure with a bridge contact hole, corrosion of an alignment line can be blocked or prevented even in case that the metal pattern is exposed from the side of the display panel.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
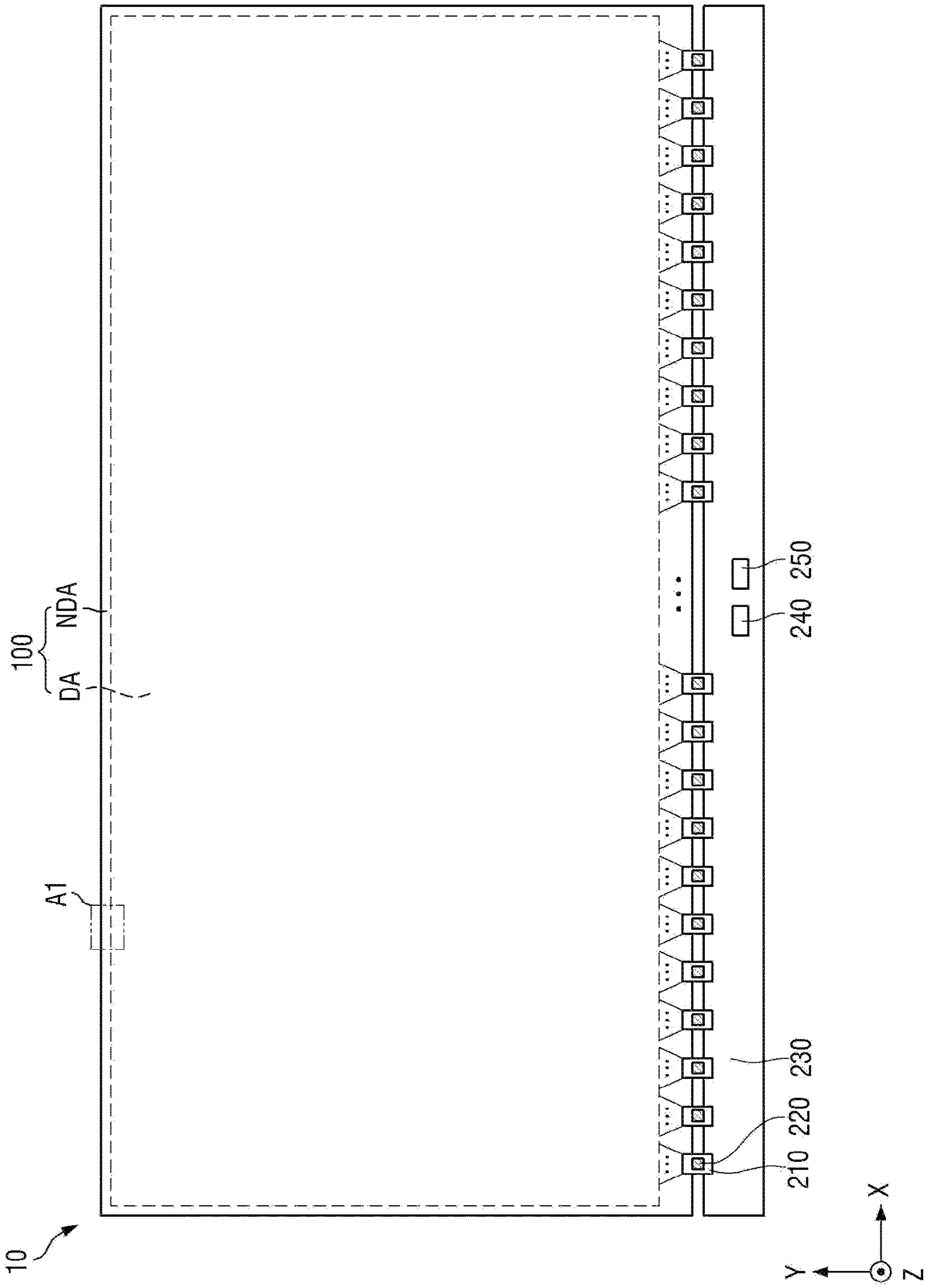
FIG. 1 is a plan view illustrating a display device according to one embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers and/or reference characters in the drawings refer to like elements throughout.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. In case that an embodiment may be implemented differently, a specific process order may be performed differently from the described order. For example, two consecutively described processes may be performed substantially at the same time or performed in an order opposite to the described order. Also, like reference numerals denote like elements.

In case that an element, such as a layer, is referred to as being "on," "connected to," or "coupled to" another element or layer, it may be directly on, connected to, or coupled to the other element or layer or intervening elements or layers may be present. However, in case that an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure including the specification and the claims, the phrase "at least one of" is intended to include the meaning of "at least one selected from the group of" for the purpose of its meaning and interpretation. For example, "at least one of A and B" may be understood to mean "A, B, or A and B.". As used herein, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or.".

Although the terms "first," "second," and the like may be used herein to describe various types of elements, these elements should not be limited by these terms. These terms are only used to distinguish one element from another element. Thus, a first element discussed below could be termed a second element, and similarly, a second element may be referred to as a first element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

The terms "substantially," "about," and other similar terms, are used as terms of approximation and not as terms of degree, and, as such, are utilized to account for inherent deviations in measured, calculated, and/or provided values that would be recognized by one of ordinary skill in the art. Hence, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terms "overlap" or "overlapped" mean that a first object may be above or below or to a side of a second object, and vice versa. The term "overlap" may include layer, stack, face or facing, extending over, covering, or partly covering or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

In case that an element is referred to as being "in contact" or "contacted" or the like to another element, the element may be in "electrical contact" or in "physical contact" with another element; or in "indirect contact" or in "direct contact" with another element.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and will not be interpreted in an ideal or excessively formal sense unless clearly so defined herein.

Hereinafter, detailed embodiments of the disclosure are described with reference to the accompanying drawings.

FIG. 1 is a plan view illustrating a display device according to one embodiment.

The terms "above," "top" and "top surface" as used herein refer to an upward direction (i.e., a Z-axis direction) with respect to the display device 10. The terms "below," "bottom" and "bottom surface" as used herein refer to a downward direction (i.e., a direction opposite to the Z-axis direction) with respect to the display device 10. Further, "left," "right," "upper," and "lower" indicate directions in case that the display device 10 is viewed from above. For example, the term "left" indicates a direction opposite to an X-axis direction, the term "right" indicates the X-axis direction, the term "upper" indicates a Y-axis direction, and the term "lower" indicates a direction opposite to the Y-axis direction.

Referring to FIG. 1, a display device 10, as a device for displaying a moving or still image, may be employed as a display screen of various products such as a television, a laptop computer, a monitor, a billboard, and an Internet of Things (IoT) device as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, and an ultra-mobile PC (UMPC).

The display device 10 may include a display panel 100, a flexible film 210, a display driver 220, a circuit board 230, a timing controller 240, and a power supply unit 250.

The display panel 100 may have a rectangular shape in a plan view. For example, the display panel 100 may have a rectangular shape, in a plan view, having long sides in a first direction (X-axis direction) and short sides in a second direction (Y-axis direction). A corner formed by the long side in the first direction (X-axis direction) and the short side in the second direction (Y-axis direction) may be right-angled or rounded with a prescribed curvature. The planar shape of the display panel 100 is not limited to the rectangular shape, and may be formed in another polygonal shape, a circular shape or an elliptical shape. For example, the display panel 100 may be formed to be flat, but is not limited thereto. In another example, the display panel 100 may be bent with a prescribed curvature.

The display panel 100 may include a display area DA and a non-display area NDA.

The display area DA may include pixels displaying an image. The display area DA may emit light from emission areas or opening areas. The display panel 100 may include a pixel circuit including switching elements, a pixel defining layer defining an emission area or an opening area, and a self-light emitting element. For example, the self-light emitting element may include an organic light emitting diode (OLED) having an organic light emitting layer, a quantum dot light emitting diode (LED) including a quantum dot light emitting layer, a micro LED, or an inorganic LED having an inorganic semiconductor, but is not limited thereto.

The non-display area NDA may be disposed around the display area DA. The non-display area NDA may be defined as the remaining area of the display panel 100 except the display area DA. For example, the non-display area NDA may include fan-out lines electrically connecting the display driver 220 and the display area DA, and a pad portion connected to the flexible film 210.

Input terminals provided on one side of the flexible film 210 may be attached to the circuit board 230 by a film attaching process, and output terminals provided at the other side of the flexible film 210 may be attached to the pad portion by the film attaching process. For example, the flexible film 210 may be bent like a tape carrier package or a chip on film. The flexible film 210 may be bent toward the lower portion of the display panel 100 to reduce the bezel area of the display device 10.

The display driver 220 may be mounted on the flexible film 210. For example, the display driver 220 may be implemented as an integrated circuit (IC). The display driver 220 may receive digital video data and a data control signal from the timing controller 240, and according to the data control signal, convert the digital video data to an analog data voltage to supply it to the data line through the fan-out line. The display driver 220 may generate a gate signal according to a gate control signal supplied from the timing controller 240, and sequentially supply the gate signal to gate lines in a set order. Accordingly, the display driver 220 may simultaneously function as a data driver and a gate driver. Since the display device 10 includes the display driver 220 disposed on the lower side of the non-display area NDA, sizes of the left side, right side, and upper side of the non-display area NDA may be minimized.

A circuit board 230 may support a timing controller 240 and the power supply unit 250, and supply signals and power to the display driver 220. For example, the circuit board 230 may supply a signal supplied from the timing controller 240 and a power voltage supplied from the power supply unit 250 to the display driver 220 to display an image on each pixel. A signal line and a power line may be provided on the circuit board 230 to supply the signal and the power voltage.

The timing controller 240 may be mounted on the circuit board 230 and receive image data and a timing synchronization signal supplied from the display driving system or a graphic device through a user connector provided on the circuit board 230. The timing controller 240 may generate digital video data by arranging the image data to fit the pixel arrangement structure based on the timing synchronization signal, and may supply the generated digital video data to the display driver 220. The timing controller 240 may generate the data control signal and the gate control signal based on the timing synchronization signal. The timing controller 240 may control the data voltage supply timing of the display driver 220 based on the data control signal, and may control the gate signal supply timing of the display driver 220 based on the gate control signal.

The power supply unit 250 may be disposed on the circuit board 230 to supply a power voltage to the display driver 220 and the display panel 100. For example, the power supply unit 250 may supply a driving voltage, a high potential voltage, a low potential voltage, or an initialization voltage to the display panel 100.

Figure 2:
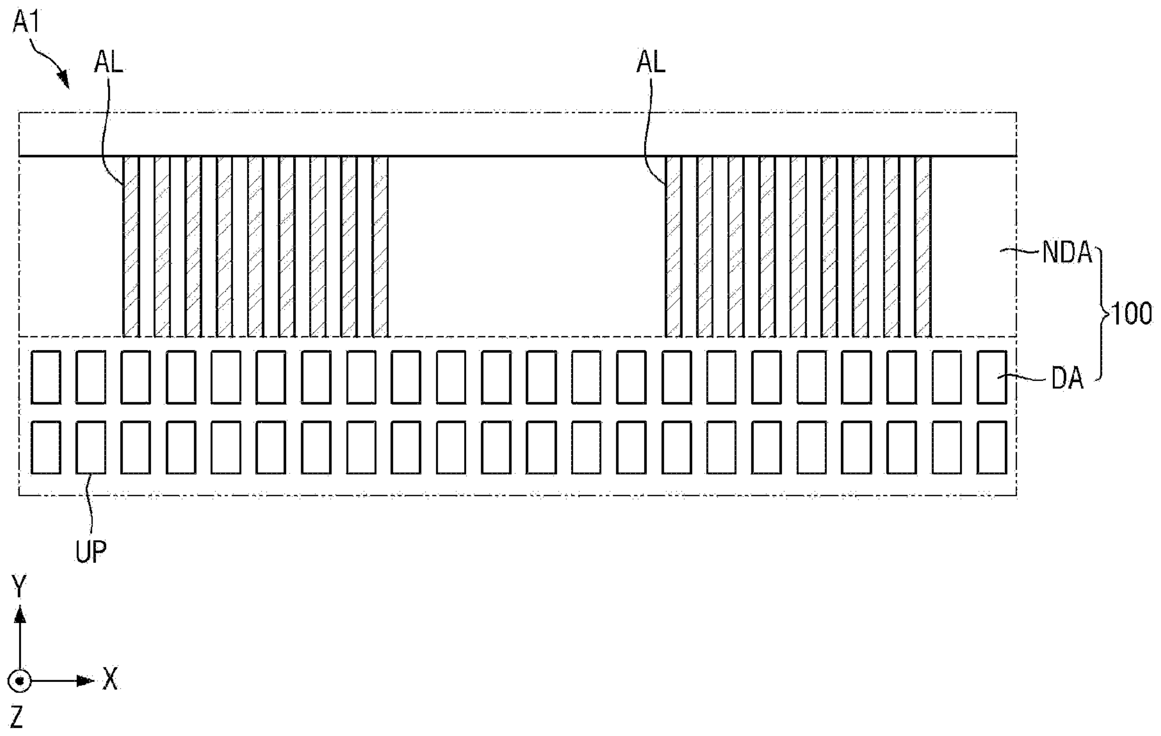
FIG. 2 is an enlarged view of area A1 of FIG. 1.

FIG. 2 is an enlarged view of area A1 of FIG. 1.

Referring to FIG. 2, the display area DA may include unit pixels UP for displaying an image. The unit pixels UP may be formed in each crossing by the data line and the gate line. For example, each of the unit pixels UP may include first to third pixels. Each of the first to third pixels may be defined as the smallest unit area for outputting light.

The non-display area NDA may include an alignment line AL extending from the edge of the display panel 100 to the display area DA. The alignment line AL may be electrically connected to an alignment electrode of the display area DA. The alignment line AL may supply an alignment signal to the alignment electrodes during a manufacturing process of the display device 10. The alignment electrodes may receive the alignment signal, and an electric field may be formed between the alignment electrodes. Light emitting elements may be injected on the alignment electrodes through an inkjet printing process. The multiple injected light emitting elements may be aligned by receiving a dielectrophoretic force exerted by the electric field formed between the alignment electrodes.

Figure 3:
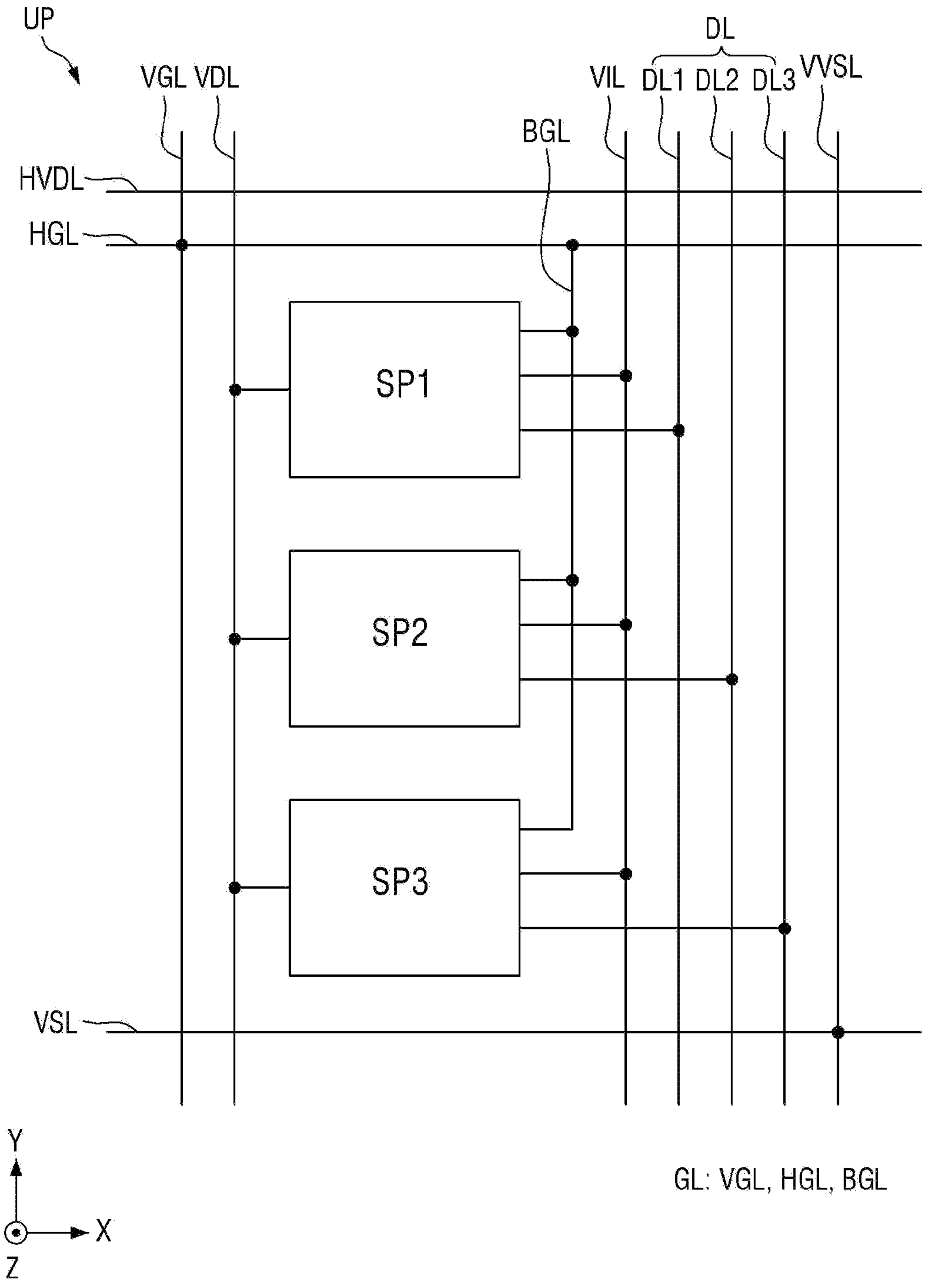
FIG. 3 is a diagram illustrating pixels and lines of a display device according to one embodiment.

FIG. 3 is a diagram illustrating pixels and lines of a display device according to one embodiment.

Referring to FIG. 3, the unit pixel UP may be disposed in the display area DA. The unit pixels UP may include first to third pixels SP1, SP2, and SP3. The pixel circuits of the first pixel SP1, the second pixel SP2 and the third pixel SP3 may be arranged in the opposite direction of the second direction (Y-axis direction), but the arrangement direction of the pixel circuits is not limited thereto.

Each of the first to third pixels SP1, SP2, and SP3 may be electrically connected to the first voltage line VDL, the initialization voltage line VIL, the gate line GL, and the data line DL.

A first voltage line VDL may extend in the second direction (Y-axis direction). The first voltage line VDL may be disposed on the left side of the pixel circuits of the first to third pixels SP1, SP2 and SP3. The first voltage line VDL may supply a driving voltage or high potential voltage to a transistor of each of the first to third pixels SP1, SP2 and SP3.

The horizontal voltage line HVDL may extend in the first direction (X-axis direction). The horizontal voltage line HVDL may be disposed to the upper side of the horizontal gate line HGL. The horizontal voltage line HVDL may be electrically connected to the first voltage line VDL. The horizontal voltage line HVDL may receive a driving voltage or a high potential voltage from the first voltage line VDL.

The initialization voltage line VIL may extend in the second direction (Y-axis direction). The initialization voltage line VIL may be disposed on the right side of the auxiliary gate line BGL. The initialization voltage line VIL may be disposed between the auxiliary gate line BGL and the data line DL. The initialization voltage line VIL may supply an initialization voltage to the pixel circuit of each of the first to third pixels SP1, SP2, and SP3. The initialization voltage line VIL may receive a sensing signal from the pixel circuit of each of the first to third pixels SP1, SP2 and SP3 to supply the sensing signal the display driver 220.

The gate line GL may include the vertical gate line VGL, the horizontal gate line HGL, and the auxiliary gate line BGL.

The vertical gate lines VGL may extend in the second direction (Y-axis direction). The vertical gate line VGL may be connected between the display driver 220 and the horizontal gate line HGL. Each of the vertical gate lines VGL may intersect the horizontal gate lines HGL. The vertical gate line VGL may supply the gate signal received from the display driver 220 to the horizontal gate line HGL.

The horizontal gate line HGL may extend in a first direction (X-axis direction). The horizontal gate line HGL may be disposed to the upper side of the pixel circuit of the first pixel SP1. The horizontal gate line HGL may be connected between the vertical gate line VGL and the auxiliary gate line BGL. The horizontal gate line HGL may supply a gate signal received from the vertical gate line VGL to the auxiliary gate line BGL.

The auxiliary gate line BGL may extend from the horizontal gate line HGL in a direction opposite to the second direction (Y-axis direction). The auxiliary gate line BGL may be disposed on the right side of the pixel circuits of the first to third pixels SP1, SP2 and SP3. The auxiliary gate line BGL may supply the gate signals received from the horizontal gate line HGL to the pixel circuits of the first to third pixels SP1, SP2 and SP3.

The data lines DL may extend in the second direction (the Y-axis direction). The data lines DL may supply a data voltage to the first to third pixels SP1, SP2, and SP3. The data lines DL may include first to third data lines DL1, DL2, and DL3.

The first data line DL1 may extend in the second direction (Y-axis direction). The first data line DL1 may be disposed on the right side of the initialization voltage line VIL. The first data line DL1 may supply the data voltage received from the display driver 220 to the pixel circuit of the first pixel SP1.

The second data line DL2 may extend in the second direction (Y-axis direction). The second data line DL2 may be disposed on the right side of the first data line DL1. The second data line DL2 may supply the data voltage received from the display driver 220 to the pixel circuit of the second pixel SP2.

The third data line DL3 may extend in the second direction (Y-axis direction). The third data line DL3 may be disposed on the right side of the second data line DL2. The third data line DL3 may supply the data voltage received from the display driver 220 to the pixel circuit of the third pixel SP3.

The vertical voltage line VVSL may extend in the second direction (Y-axis direction). The vertical voltage line VVSL may be disposed on the right side of the third data line DL3. The vertical voltage line VVSL may be connected between the power supply unit 250 and the second voltage line VSL. The vertical voltage line VVSL may supply the low potential voltage supplied from the power supply unit 250 to the second voltage line VSL.

The second voltage line VSL may extend in the first direction (X-axis direction). The second voltage line VSL may be disposed to the lower side of the pixel circuit of the second pixel SP2. The second voltage line VSL may supply the low potential voltage received from the vertical voltage line VVSL to a light emitting element layer of the first to third pixels SP1, SP2, and SP3.

Figure 4:
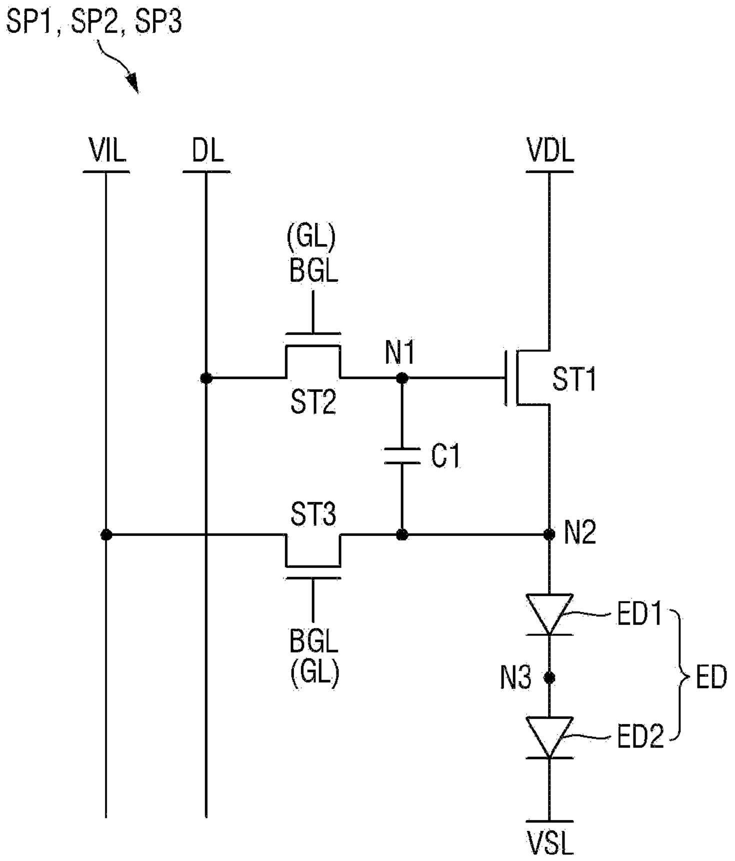
FIG. 4 is a schematic diagram of an equivalent circuit of a pixel of a display device according to one embodiment.

FIG. 4 is a schematic diagram of an equivalent circuit of a pixel of a display device according to one embodiment.

Referring to FIG. 4, each of the first to third pixels SP1, SP2, and SP3 may be electrically connected to the first voltage line VDL, the data line DL, the initialization voltage line VIL, the gate line GL, and the second voltage line VSL.

Each of the first to third pixels SP1, SP2, and SP3 may include first to third transistors ST1, ST2, and ST3, a first capacitor C1, and light emitting elements ED.

The first transistor ST1 may include a gate electrode, a drain electrode, and a source electrode. The gate electrode of the first transistor ST1 may be electrically connected to a first node N1, the drain electrode thereof may be electrically connected to the first voltage line VDL, and the source electrode thereof may be electrically connected to a second node N2. The first transistor ST1 may control a drain-source current (or driving current) based on a data voltage applied to the gate electrode.

The light emitting elements ED may include a first light emitting element ED1 and a second light emitting element ED2. The first and second light emitting elements ED1 and ED2 may be connected in series. The first and second light emitting elements ED1 and ED2 may receive a driving current to emit light. The light emission amount or the luminance of the light emitting element ED may be proportional to the magnitude of the driving current. The light emitting element ED may be an inorganic light emitting element including an inorganic semiconductor, but is not limited thereto.

The first electrode of the first light emitting element ED1 may be electrically connected to the second node N2, and the second electrode of the first light emitting element ED1 may be electrically connected to a third node N3. The first electrode of the first light emitting element ED1 may be electrically connected to the source electrode of the first transistor ST1, the source electrode of the third transistor ST3 and a second capacitor electrode of the first capacitor C1 through the second node N2. The second electrode of the first light emitting element ED1 may be electrically connected to the first electrode of the second light emitting element ED2 through the third node N3. The first electrode of the second light emitting element ED2 may be electrically connected to the third node N3 and the second electrode of the second light emitting element ED2 may be electrically connected to the second voltage line VSL.

The second transistor ST2 may be turned on by the gate signal of the gate line GL to electrically connect the data line DL to the first node N1 which is the gate electrode of the first transistor ST1. The second transistor ST2 may be turned on according to the gate signal to supply the data voltage to the first node N1. The gate electrode of the second transistor ST2 may be electrically connected to the gate line GL, the drain electrode thereof may be electrically connected to the data line DL, and the source electrode thereof may be electrically connected to the first node N1. The source electrode of the second transistor ST2 may be electrically connected to the gate electrode of the first transistor ST1 and a first capacitor electrode of the first capacitor C1 through the first node N1.

The third transistor ST3 may be turned on by the gate signal of the gate line GL to electrically connect the initialization voltage line VIL to the second node N2 which is the source electrode of the first transistor ST1. The third transistor ST3 may be turned on according to the gate signal to supply the initialization voltage to the second node N2. The third transistor ST3 may be turned on according to the gate signal to supply the sensing signal to the initialization voltage line VIL. The gate electrode of the third transistor ST3 may be electrically connected to the gate line GL, the drain electrode thereof may be electrically connected to the initialization voltage line VIL, and the source electrode thereof may be electrically connected to the second node N2. The source electrode of the third transistor ST3 may be electrically connected to the source electrode of the first transistor ST1, the second capacitor electrode of the first capacitor C1 and the first electrode of the first light emitting element ED1 through the second node N2.

Figure 5:
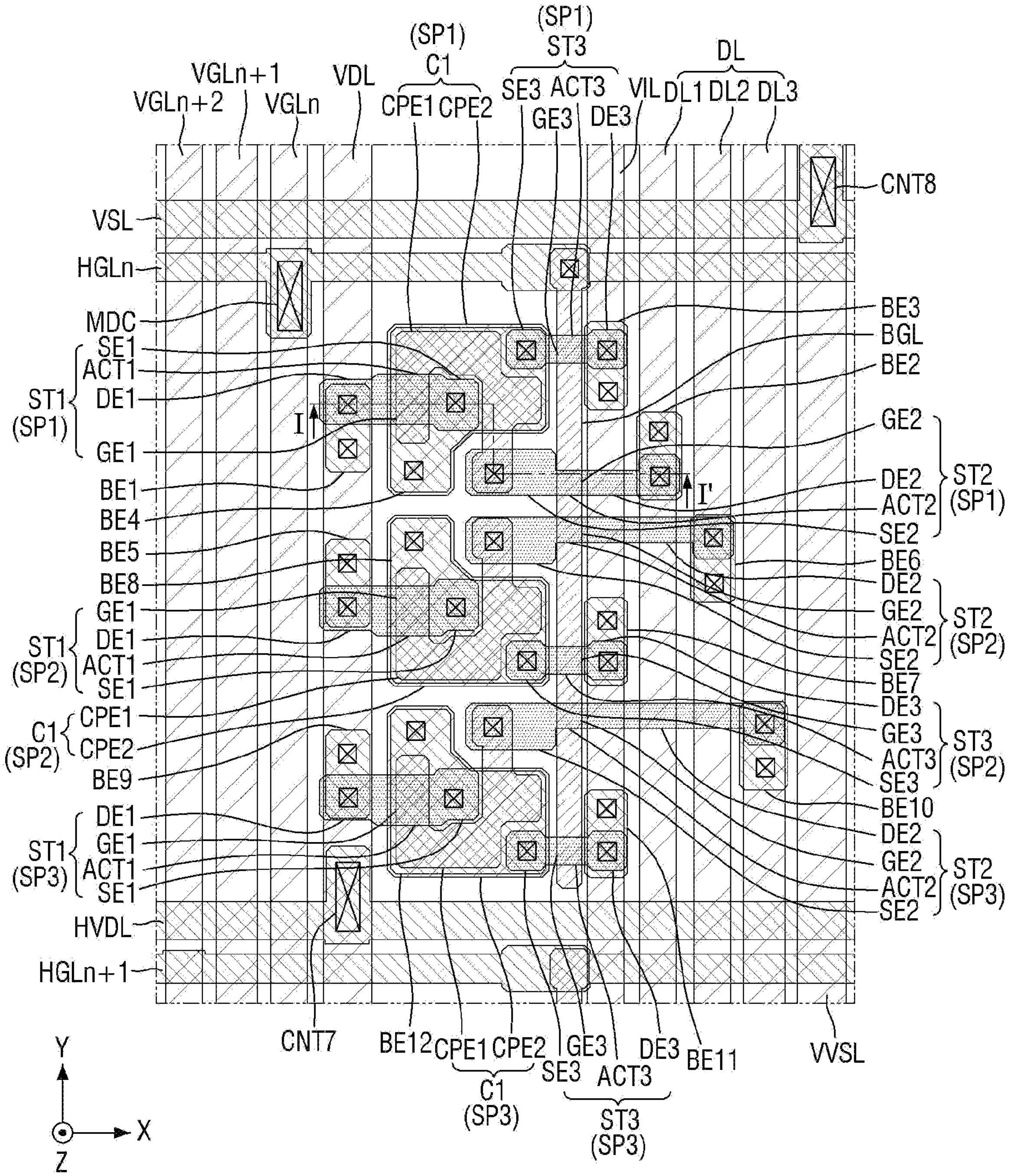
FIGS. 5 and 6 are plan views illustrating a thin film transistor layer of a display device according to one embodiment.
Figure 6:
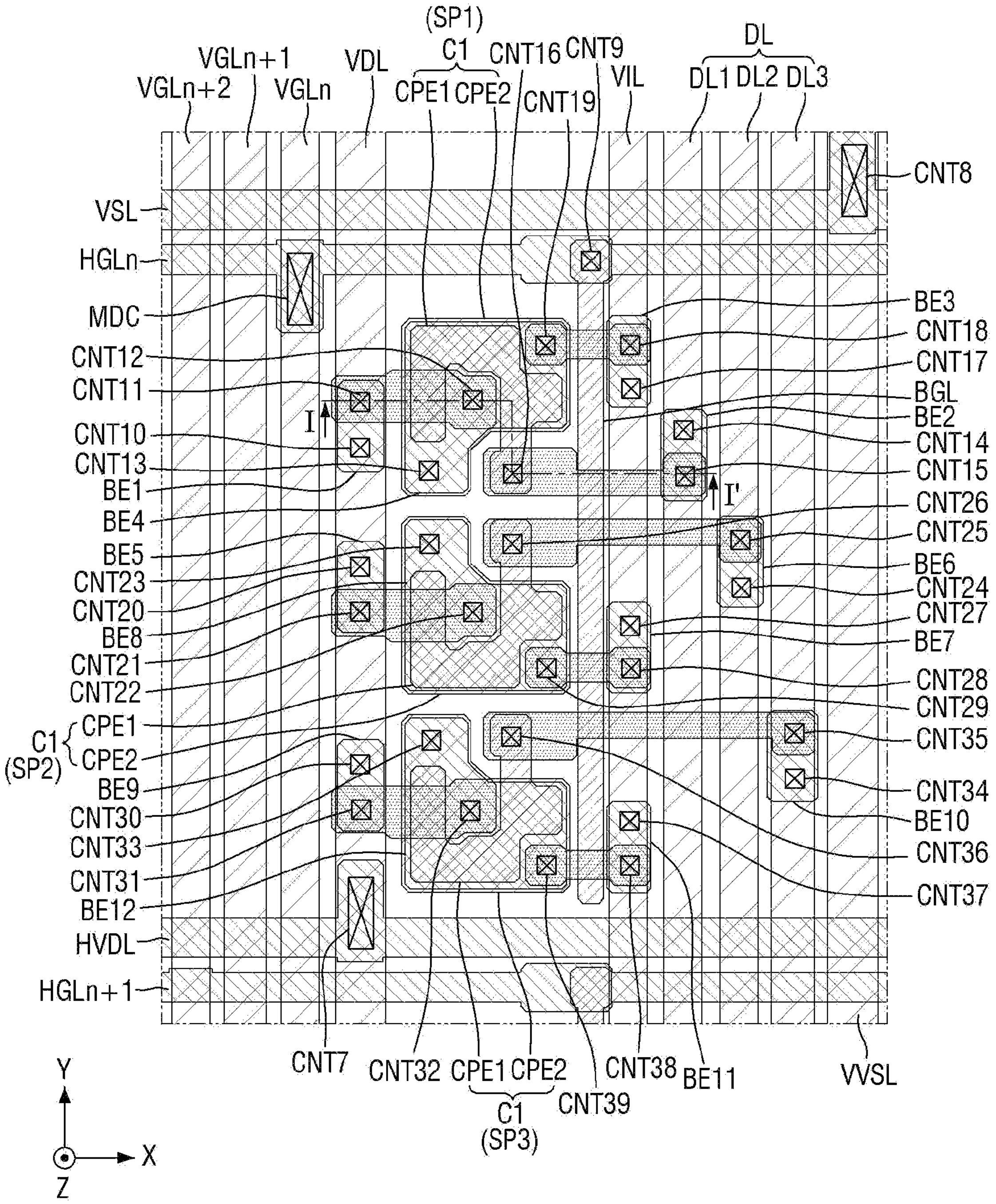
Figure 7:
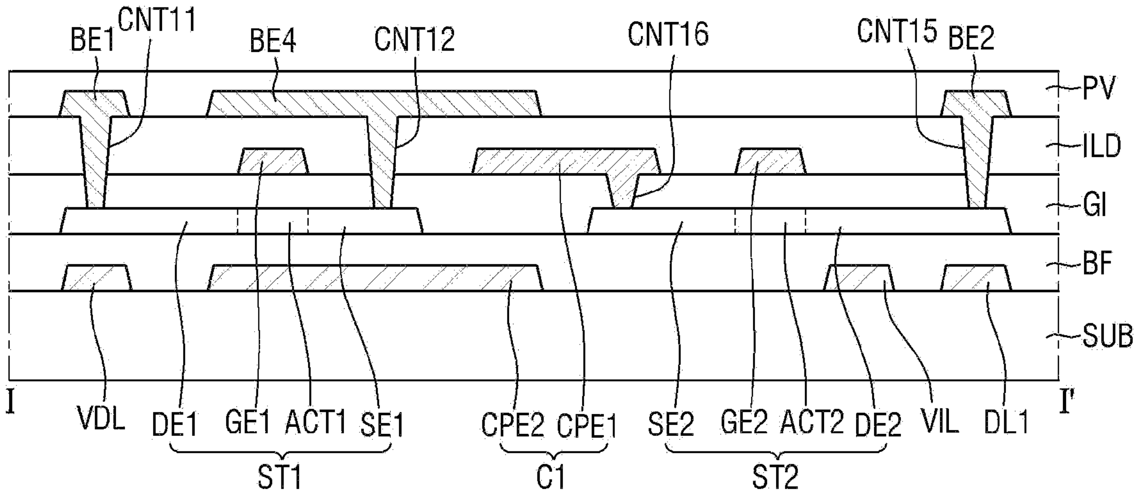
FIG. 7 is a schematic cross-sectional view taken along line I-I' of FIGS. 5 and 6.

FIGS. 5 and 6 are plan views illustrating a thin film transistor layer of a display device according to one embodiment, and FIG. 7 is a schematic cross-sectional view taken along line I-I' of FIGS. 5 and 6. FIGS. 5 and 6 illustrate by dividing the reference numerals of the same view.

Referring to FIGS. 5 to 7, the display area DA may include the unit pixel UP, the first voltage line VDL, the horizontal voltage line HVDL, the vertical gate line VGL, the horizontal gate line HGL, the auxiliary gate line BGL, the initialization voltage line VIL, the data line DL, the vertical voltage line VVSL, and the second voltage line VSL. The unit pixels UP may include first to third pixels SP1, SP2, and SP3. The pixel circuit of the first pixel SP1, the pixel circuit of the second pixel SP2 and the pixel circuit of the third pixel SP3 may be arranged in the opposite direction of the second direction (Y-axis direction).

The first voltage line VDL may be disposed in a first metal layer MTL1 on the substrate SUB. The first voltage line VDL may be disposed on the left side of the pixel circuits of the first to third pixels SP1, SP2 and SP3. The first voltage line VDL may be electrically connected to a first connection electrode BE1 of a third metal layer MTL3 through a tenth contact hole CNT10, and the first connection electrode BE1 may be electrically connected to a drain electrode DE1 of the first transistor ST1 of the first pixel SP1 through an eleventh contact hole CNT11. The first voltage line VDL may be electrically connected to a fifth connection electrode BE5 of the third metal layer MTL3 through a twentieth contact hole CNT20, and the fifth connection electrode BE5 may be electrically connected to the drain electrode DE1 of the first transistor ST1 of the second pixel SP2 through a twenty-first contact hole CNT21. The first voltage line VDL may be electrically connected to a ninth connection electrode BE9 of the third metal layer MTL3 through a thirtieth contact hole CNT30, and the ninth connection electrode BE9 may be electrically connected to the drain electrode DE1 of the first transistor ST1 of the third pixel SP3 through a thirty-first contact hole CNT31.

The horizontal voltage line HVDL may be disposed in the third metal layer MTL3. The third metal layer MTL3 may be disposed on an interlayer insulating layer ILD covering a second metal layer MTL2. The horizontal voltage line HVDL may be disposed on the upper side of some of the horizontal gate lines HGL. The horizontal voltage line HVDL may be electrically connected to the multiple first voltage lines VDL through the seventh contact hole CNT7 to receive a driving voltage. The horizontal voltage line HVDL may stably maintain the driving voltage or the high potential voltage of the first voltage lines VDL.

The vertical gate line VGL may be disposed in the first metal layer MTL1. The vertical gate line VGL may include the $n^{th}$ vertical gate line VGLn (n being a positive integer), the $(n+1)^{th}$ vertical gate line VGLn+1, and the $(n+2)^{th}$ vertical gate line VGLn+2 disposed on the left side of the first voltage line VDL. The $n^{th}$ vertical gate line VGLn may be electrically connected to the $n^{th}$ horizontal gate line HGLn through the contact portion MDC, and may be insulated from the remaining horizontal gate lines HGL.

The horizontal gate line HGL may be disposed in the third metal layer MTL3. The horizontal gate line HGL may be disposed to the upper side of the pixel circuit of the first pixel SP1. The $n^{th}$ horizontal gate line HGLn may be electrically connected to the $n^{th}$ vertical gate line VGLn through the contact portion MDC. The $n^{th}$ horizontal gate line HGLn may be electrically connected to the auxiliary gate line BGL through a ninth contact hole CNT9. The $n^{th}$ horizontal gate line HGLn may supply a gate signal received from the $n^{th}$ vertical gate line VGLn to the auxiliary gate line BGL.

The auxiliary gate line BGL may be disposed in the second metal layer MTL2. The second metal layer MTL2 may be disposed on a gate insulating layer GI covering an active layer ACTL. The auxiliary gate line BGL may extend from the horizontal gate line HGL in a direction opposite to the second direction (Y-axis direction). The auxiliary gate line BGL may be disposed on the right side of the pixel circuits of the first to third pixels SP1, SP2 and SP3. The auxiliary gate line BGL may supply the gate signals received from the horizontal gate line HGL to the first to third pixels SP1, SP2 and SP3.

The initialization voltage line VIL may be disposed in the first metal layer MTL1. The initialization voltage line VIL may be disposed on the right side of the auxiliary gate line BGL. The initialization voltage line VIL may be electrically connected to a third connection electrode BE3 of the third metal layer MTL3 through a seventeenth contact hole CNT17, and the third connection electrode BE3 may be electrically connected to a drain electrode DE3 of the third transistor ST3 of the first pixel SP1 through the eighteenth contact hole CNT18. The initialization voltage line VIL may be electrically connected to a seventh connection electrode BE7 of the third metal layer MTL3 through a twenty-seventh contact hole CNT27, and the seventh connection electrode BE7 may be electrically connected to the drain electrode DE3 of the third transistor ST3 of the second pixel SP2 through a twenty-eighth contact hole CNT28. The initialization voltage line VIL may be electrically connected to an eleventh connection electrode BE11 of the third metal layer MTL3 through a thirty-seventh contact hole CNT37, and the eleventh connection electrode BE11 may be electrically connected to the drain electrode DE3 of the third transistor ST3 of the third pixel SP3 through a thirty-eighth contact hole CNT38. Accordingly, the initialization voltage line VIL may supply the initialization voltage to the third transistor ST3 of each of the first to third pixels SP1, SP2 and SP3 and receive the sensing signal from the third transistor ST3.

The first data line DL1 may be disposed in the first metal layer MTL1. The first data line DL1 may be disposed on the right side of the initialization voltage line VIL. The first data line DL1 may be electrically connected to a second connection electrode BE2 of the third metal layer MTL3 through a fourteenth contact hole CNT14, and the second connection electrode BE2 may be electrically connected to the drain electrode DE2 of the second transistor ST2 of the first pixel SP1 through a fifteenth contact hole CNT15. The first data line DL1 may supply a data voltage to the second transistor ST2 of the first pixel SP1.

The second data line DL2 may be disposed in the first metal layer MTL1. The second data line DL2 may be disposed on the right side of the first data line DL1. The second data line DL2 may be electrically connected to a sixth connection electrode BE6 of the third metal layer MTL3 through a twenty-fourth contact hole CNT24, and the sixth connection electrode BE6 may be electrically connected to the drain electrode DE2 of the second transistor ST2 of the second pixel SP2 through a twenty-fifth contact hole CNT25. The second data line DL2 may supply a data voltage to the second transistor ST2 of the second pixel SP2.

The third data line DL3 may be disposed in the first metal layer MTL1. The third data line DL3 may be disposed on the right side of the second data line DL2. The third data line DL3 may be electrically connected to a tenth connection electrode BE10 of the third metal layer MTL3 through a thirty-fourth contact hole CNT34, and the tenth connection electrode BE10 may be electrically connected to the drain electrode DE2 of the second transistor ST2 of the third pixel SP3 through a thirty-fifth contact hole CNT35. The third data line DL3 may supply a data voltage to the second transistor ST2 of the third pixel SP3.

The vertical voltage line VVSL may be disposed in the first metal layer MTL1. The vertical voltage line VVSL may be disposed on the right side of the third data line DL3. The vertical voltage line VVSL may be electrically connected to the second voltage line VSL of the third metal layer MTL3 through an eighth contact hole CNT8. The vertical voltage line VVSL may supply a low potential voltage to the second voltage line VSL.

The second voltage line VSL may be disposed in the third metal layer MTL3. The second voltage line VSL may be disposed on the upper side of some others of the horizontal gate lines HGL. The second voltage line VSL may supply the low potential voltage received from the vertical voltage line VVSL to the third electrode of each of the first to third pixels SP1, SP2, and SP3. Here, the third electrode of each of the first to third pixels SP1, SP2, and SP3 may be disposed in a fourth metal layer on the third metal layer MTL3.

The pixel circuit of the first pixel SP1 may include first to third transistors ST1, ST2 and ST3. The first transistor ST1 of the first pixel SP1 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be disposed in the second metal layer MTL2. The gate electrode GE1 of the first transistor ST1 may be a part of the first capacitor electrode CPE1 of the first capacitor C1. The first capacitor electrode CPE1 may be electrically connected to a source electrode SE2 of the second transistor ST2 of the active layer ACTL through a sixteenth contact hole CNT16.

The drain electrode DE1 and the source electrode SE1 of the first transistor ST1 may be made conductive by heat treatment of the active layer ACTL. The drain electrode DE1 of the first transistor ST1 may be electrically connected to the first voltage line VDL via the first connection electrode BE1. The drain electrode DE1 of the first transistor ST1 may receive the driving voltage from the first voltage line VDL.

The source electrode SE1 of the first transistor ST1 may be electrically connected to a fourth connection electrode BE4 of the third metal layer MTL3 through a twelfth contact hole CNT12. The fourth connection electrode BE4 may be electrically connected to a second capacitor electrode CPE2 of the first metal layer MTL1 through a thirteenth contact hole CNT13. Accordingly, the first capacitor C1 may be formed doubly between the first capacitor electrode CPE1 and the second capacitor electrode CPE2 and between the first capacitor electrode CPE1 and the fourth connection electrode BE4.

The fourth connection electrode BE4 may be electrically connected to a source electrode SE3 of the third transistor ST3 through a nineteenth contact hole CNT19. The fourth connection electrode BE4 may be electrically connected to the first electrode of the first pixel SP1. Here, the first electrode of the first pixel SP1 may be disposed in the fourth metal layer.

The second transistor ST2 of the first pixel SP1 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the first data line DL1 through the second connection electrode BE2. The drain electrode DE2 of the second transistor ST2 may receive the data voltage of the first pixel SP1 from the first data line DL1.

The source electrode SE2 of the second transistor ST2 may be electrically connected to the gate electrode GE1 of the first transistor ST1 by being electrically connected to the first capacitor electrode CPE1 through a sixteenth contact hole CNT16.

The third transistor ST3 of the first pixel SP1 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the initialization voltage line VIL through the third connection electrode BE3. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be electrically connected to the fourth connection electrode BE4 through a nineteenth contact hole CNT19. The fourth connection electrode BE4 may be electrically connected to the source electrode SE1 of the first transistor ST1 through the twelfth contact hole CNT12, and may be electrically connected to the second capacitor electrode CPE2 of the first metal layer MTL1 through the thirteenth contact hole CNT13.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of the first capacitor electrode CPE1 of the first capacitor C1. The first capacitor electrode CPE1 may be electrically connected to the source electrode SE2 of the second transistor ST2 of the active layer ACTL through a twenty-sixth contact hole CNT26.

The drain electrode DE1 and the source electrode SE1 of the first transistor ST1 may be made conductive by heat treatment of the active layer. The drain electrode DE1 of the first transistor ST1 may be electrically connected to the first voltage line VDL via the fifth connection electrode BE5. The drain electrode DE1 of the first transistor ST1 may receive the driving voltage from the first voltage line VDL.

The source electrode SE1 of the first transistor ST1 may be electrically connected to an eighth connection electrode BE8 of the third metal layer MTL3 through a twenty-second contact hole CNT22. The eighth connection electrode BE8 may be electrically connected to the second capacitor electrode CPE2 of the first metal layer MTL1 through a twenty-third contact hole CNT23. Accordingly, the first capacitor C1 may be formed doubly between the first capacitor electrode CPE1 and the second capacitor electrode CPE2 and between the first capacitor electrode CPE1 and the eighth connection electrode BE8.

The eighth connection electrode BE8 may be electrically connected to the source electrode SE3 of the third transistor ST3 through the twenty-ninth contact hole CNT29. The eighth connection electrode BE8 may be electrically connected to the first electrode of the second pixel SP2. Here, the first electrode of the second pixel SP2 may be disposed in the fourth metal layer.

The second transistor ST2 of the second pixel SP2 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the second data line DL2 through the sixth connection electrode BE6. The drain electrode DE2 of the second transistor ST2 may receive the data voltage of the second pixel SP2 from the second data line DL2.

The source electrode SE2 of the second transistor ST2 may be electrically connected to the gate electrode GE1 of the first transistor ST1 by being electrically connected to the first capacitor electrode CPE1 through a twenty-sixth contact hole CNT26.

The third transistor ST3 of the second pixel SP2 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the initialization voltage line VIL through the seventh connection electrode BE7. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be electrically connected to the eighth connection electrode BE8 through the twenty-ninth contact hole CNT29. The eighth connection electrode BE8 may be electrically connected to the source electrode SE1 of the first transistor ST1 through the twenty-second contact hole CNT22, and may be electrically connected to the second capacitor electrode CPE2 of the first metal layer MTL1 through the twenty-third contact hole CNT23.

The pixel circuit of the third pixel SP3 may include first to third transistors ST1, ST2 and ST3. The first transistor ST1 of the third pixel SP3 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of the first capacitor electrode CPE1 of the first capacitor C1. The first capacitor electrode CPE1 may be electrically connected to the source electrode SE2 of the second transistor ST2 of the active layer ACTL through a thirty-sixth contact hole CNT36.

The drain electrode DE1 and the source electrode SE1 of the first transistor ST1 may be made conductive by heat treatment of the active layer. The drain electrode DE1 of the first transistor ST1 may be electrically connected to the first voltage line VDL via the ninth connection electrode BE9. The drain electrode DE1 of the first transistor ST1 may receive the driving voltage from the first voltage line VDL.

The source electrode SE1 of the first transistor ST1 may be electrically connected to a twelfth connection electrode BE12 of the third metal layer MTL3 through a thirty-second contact hole CNT32. The twelfth connection electrode BE12 may be electrically connected to the second capacitor electrode CPE2 of the first metal layer MTL1 through a thirty-third contact hole CNT33. Accordingly, the first capacitor C1 may be formed doubly between the first capacitor electrode CPE1 and the second capacitor electrode CPE2 and between the first capacitor electrode CPE1 and the twelfth connection electrode BE12.

The twelfth connection electrode BE12 may be electrically connected to the source electrode SE3 of the third transistor ST3 through a thirty-ninth contact hole CNT39. The twelfth connection electrode BE12 may be electrically connected to the first electrode of the third pixel SP3. Here, the first electrode of the third pixel SP3 may be disposed in the fourth metal layer.

The second transistor ST2 of the third pixel SP3 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the third data line DL3 through the tenth connection electrode BE10. The drain electrode DE2 of the second transistor ST2 may receive the data voltage of the third pixel SP3 from the third data line DL3.

The source electrode SE2 of the second transistor ST2 may be electrically connected to the gate electrode GE1 of the first transistor ST1 by being electrically connected to the first capacitor electrode CPE1 through a thirty-sixth contact hole CNT36.

The third transistor ST3 of the third pixel SP3 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the initialization voltage line VIL through the eleventh connection electrode BE11. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be electrically connected to the twelfth connection electrode BE12 through the thirty-ninth contact hole CNT39. The twelfth connection electrode BE12 may be electrically connected to the source electrode SE1 of the first transistor ST1 through the thirty-second contact hole CNT32, and may be electrically connected to the second capacitor electrode CPE2 of the first metal layer MTL1 through the thirty-third contact hole CNT33.

Figure 8:
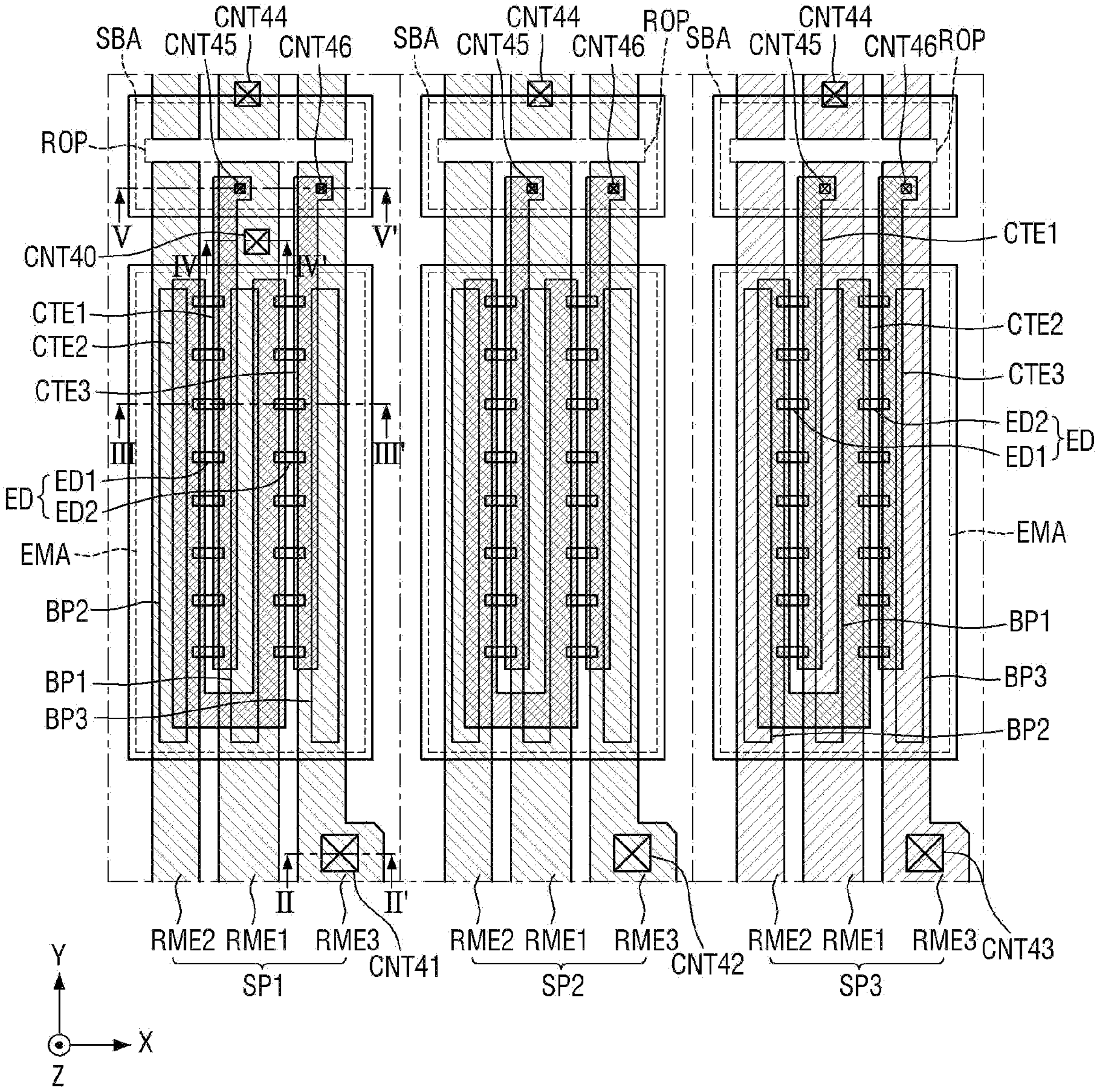
FIG. 8 is a plan view illustrating a light emitting element layer of a display device according to one embodiment.
Figure 9:
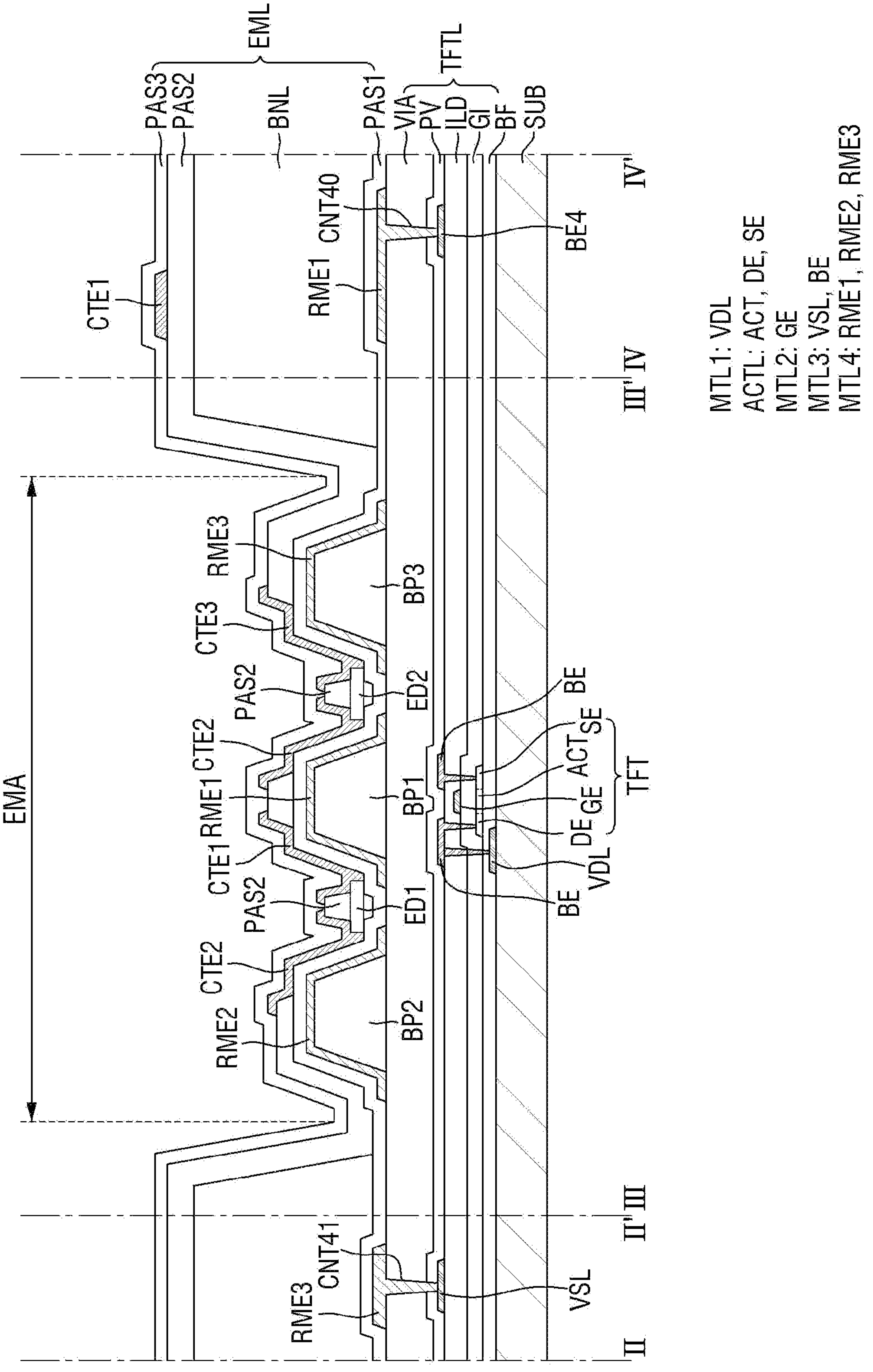
FIG. 9 is a schematic cross-sectional view taken along lines and IV-IV' of FIG. 8.
Figure 10:
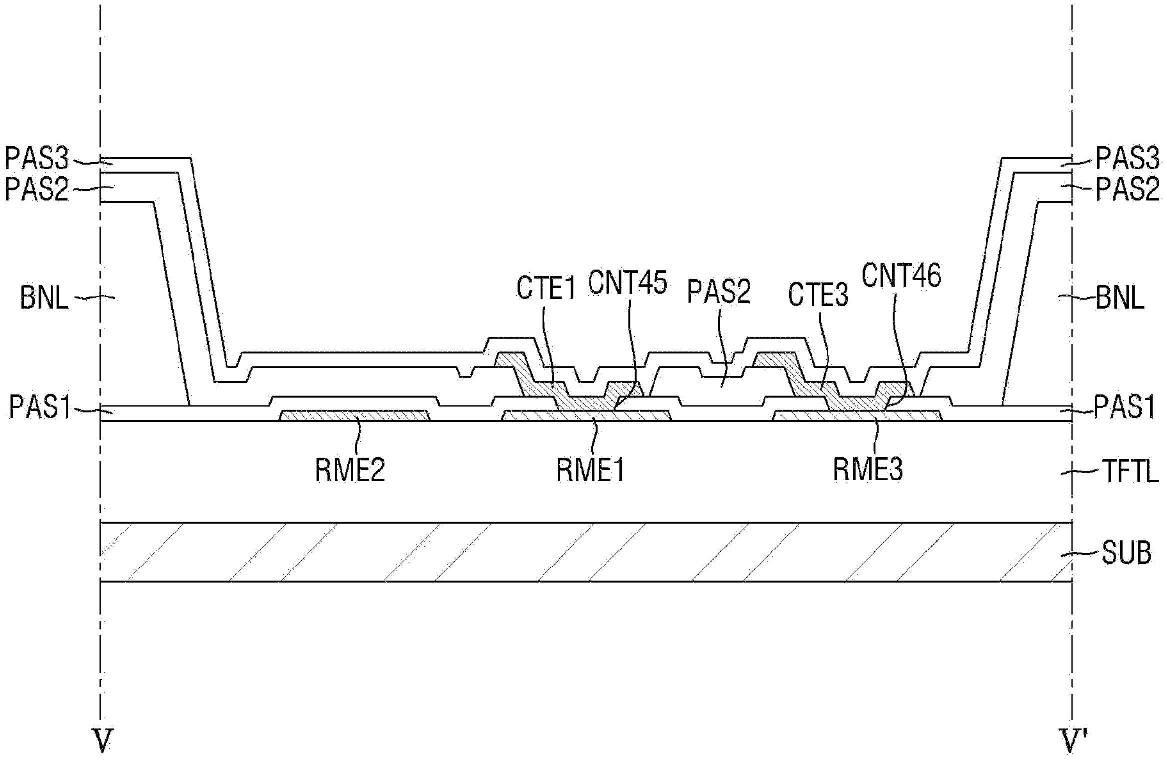
FIG. 10 is a schematic cross-sectional view taken along line V-V of FIG. 8.

FIG. 8 is a plan view illustrating a light emitting element layer of a display device according to one embodiment. FIG. 9 is a schematic cross-sectional view taken along lines II-II' III-III' and IV-IV' of FIG. 8. FIG. 10 is a schematic cross-sectional view taken along line V-V of FIG. 8.

Referring to FIGS. 8 to 10, a thin film transistor layer TFTL may include the first voltage line VDL, a thin film transistor TFT, the connection electrode BE, the second voltage line VSL, and the fourth connection electrode BE4. The first voltage line VDL may be disposed in a first metal layer MTL1 on the substrate SUB. The active region ACT, the drain electrode DE, and the source electrode SE of the thin film transistor TFT may be disposed in the active layer ACTL on the buffer layer BF. The gate electrode GE of the thin film transistor TFT may be disposed in the second metal layer MTL2 on the gate insulating layer GI. The second voltage line VSL, the connection electrode BE, and the fourth connection electrode BE4 may be disposed in the third metal layer MTL3 on the interlayer insulating layer ILD.

The light emitting element layer EML of the display device 10 may be disposed on the thin film transistor layer TFTL. The light emitting element layer EML may include first to third bank patterns BP1, BP2, and BP3, first to third electrodes RME1, RME2, and RME3, the first and second light emitting elements ED1 and ED2, a first insulating layer PAS1, a bank layer BNL, a second insulating layer PAS2, first to third contact electrodes CTE1, CTE2, and CTE3, and a third insulating layer PAS3.

The first bank pattern BP1 may be disposed in the center of an emission area EMA, the second bank pattern BP2 may be disposed on the left side of the emission area EMA, and the third bank pattern BP3 may be disposed on the right side of the emission area EMA. Each of the first to third bank patterns BP1, BP2, and BP3 may protrude in the upward direction (Z-axis direction) on a via layer VIA. Each of the first to third bank patterns BP1, BP2, and BP3 may have an inclined side surface. The multiple first light emitting elements ED1 may be disposed between the first and second bank patterns BP1 and BP2 spaced apart from each other, and the second light emitting elements ED2 may be disposed between the second and third bank patterns BP2 and BP3 spaced apart from each other. The first to third bank patterns BP1, BP2, and BP3 may have the same length in the second direction (Y-axis direction) and different lengths in the first direction (X-axis direction), but are not limited thereto. The first to third bank patterns BP1, BP2, and BP3 may be disposed in island-like patterns on the entire surface of the display area DA.

The first to third electrodes RME1, RME2, and RME3 of each of the first to third pixels SP1, SP2 and SP3 may be disposed in the fourth metal layer MTL4. The fourth metal layer MTL4 may be disposed on the via layer VIA and the first to third bank patterns BP1, BP2, and BP3. The first electrode RME1 may extend in the second direction (Y-axis direction) from the center of the emission area EMA. The first electrode RME1 may cover a top surface and an inclined side surface of the first bank pattern BP1. Accordingly, the first electrode RME1 may reflect the light emitted from the first and second light emitting elements ED1 and ED2 in the upward direction (Z-axis direction).

The second electrode RME2 may extend in the second direction (Y-axis direction) from the left side of the emission area EMA. The second electrode RME2 may cover a top surface and an inclined side surface of the second bank pattern BP2. Accordingly, the second electrode RME1 may reflect the light emitted from the first light emitting element ED1 in the upward direction (Z-axis direction).

The third electrode RME3 may extend in the second direction (Y-axis direction) from the right side of the emission area EMA. The third electrode RME3 may cover the top surface and the inclined side surface of the third bank pattern BP3. Accordingly, the third electrode RME3 may reflect the light emitted from the second light emitting element ED2 in the upward direction (Z-axis direction).

One ends of the first to third electrodes RME1, RME2, and RME3 may be separated on a row basis by the separation portion ROP. The first to third electrodes RME1, RME2, and RME3 may be alignment electrodes that align the first and second light emitting elements ED1 and ED2 during the manufacturing process of the display device 10. The first electrode RME1 before separation may be electrically connected to the horizontal voltage line HVDL of the third metal layer MTL3 through a forty-fourth contact hole CNT44, and may receive a high potential voltage or a driving voltage supplied from the alignment line AL of the non-display area NDA to function as the alignment electrode. The second and third electrodes RME2 and RME3 before separation may receive a low potential voltage supplied from the alignment line AL to function as the alignment electrodes. Accordingly, the first to third electrodes RME1, RME2, and RME3 may be separated by the separation portion ROP after the alignment process of the light emitting elements ED is completed.

The first electrode RME1 of the first pixel SP1 may be electrically connected to the fourth connection electrode BE4 of the third metal layer MTL3 through a fortieth contact hole CNT40. The first electrode RME1 may receive the driving current having passed through the first transistor ST1 from the fourth connection electrode BE4. The first electrode RME1 may supply a driving current to the first light emitting elements ED1 of the first pixel SP1 through the first contact electrode CTE1.

The third electrode RME3 of the first pixel SP1 may be electrically connected to the second voltage line VSL of the third metal layer MTL3 through a forty-first contact hole CNT41. Accordingly, the third electrode RME3 of the first pixel SP1 may receive a low potential voltage from the second voltage line VSL.

The third electrode RME3 of the second pixel SP2 may be electrically connected to the second voltage line VSL of the third metal layer MTL3 through a forty-second contact hole CNT42. Accordingly, the third electrode RME3 of the second pixel SP2 may receive a low potential voltage from the second voltage line VSL.

The third electrode RME3 of the third pixel SP3 may be electrically connected to the second voltage line VSL of the third metal layer MTL3 through a forty-third contact hole CNT43. Accordingly, the third electrode RME3 of the third pixel SP3 may receive a low potential voltage from the second voltage line VSL.

Light emitting elements ED1 may be aligned between the first electrode RME1 and the second electrode RME2. The first insulating layer PAS1 may cover the first to third electrodes RME1, RME2, and RME3. The first light emitting elements ED1 may be insulated from the first and second electrodes RME1 and RME2 by the first insulating layer PAS1. Before the first and second electrode RME1 and RME2 are separated by the separation portion ROP, each of the first and second electrodes RME1 and RME2 may receive the alignment signal supplied from alignment line AL, and the electric field may be formed between the first and second electrodes RME1 and RME2. For example, the first light emitting elements ED1 may be sprayed on the first and second electrodes RME1 and RME2 through an inkjet printing process, and the first light emitting elements ED1 dispersed in ink may be aligned by a dielectrophoretic force due to the electric field formed between the first and second electrodes RME1 and RME2. Accordingly, the first light emitting elements ED1 may be aligned in the second direction (Y-axis direction) between the first and second electrodes RME1 and RME2.

Second light emitting elements ED2 may be aligned between the first electrode RME1 and the third electrode RME3. The second light emitting elements ED2 may be insulated from the first and third electrodes RME1 and RME3 by the first insulating layer PAS1. Before the first and third electrode RME1 and RME3 are separated by the separation portion ROP, each of the first and third electrodes RME1 and RME3 may receive the alignment signal supplied from alignment line AL, and the electric field may be formed between the first and third electrodes RME1 and RME3. For example, the second light emitting elements ED2 may be sprayed on the first and third electrodes RME1 and RME3 through the inkjet printing process, and the second light emitting elements ED2 sprayed in ink may be aligned by receiving a dielectrophoretic force by the electric field formed between the first and third electrodes RME1 and RME3. Accordingly, the second light emitting elements ED2 may be aligned in the second direction (Y-axis direction) between the first and third electrodes RME1 and RME3.

The first to third contact electrodes CTE1, CTE2, and CTE3 of each of the first to third pixels SP1, SP2, and SP3 may be disposed on the first to third electrodes RME1, RME2, and RME3. The second insulating layer PAS2 may be disposed on the bank layer BNL, the first insulating layer PAS1, and the central portions of the light emitting elements ED. The third insulating layer PAS3 may cover the second insulating layer PAS2 and the first to third contact electrodes CTE1, CTE2, and CTE3. The second and third insulating layers PAS2 may insulate each of the first to third contact electrodes CTE1, CTE2, and CTE3.

The first contact electrode CTE1 may be disposed on the first electrode RME1, and electrically connected to the first electrode RME1 through a forty-fifth contact hole CNT45. The first contact electrode CTE1 may be connected between the first electrode RME1 and one ends of the first light emitting elements ED1. The first contact electrode CTE1 may correspond to an anode electrode of the first light emitting elements ED1, but the disclosure is not limited thereto.

The second contact electrode CTE2 may be disposed on the first and second electrodes RME1 and RME2, and be insulated from the first and second electrodes RME1 and RME2. The first portion of the second contact electrode CTE2 may be disposed on the second electrode RME2, and extend in the second direction (Y-axis direction). The second portion of the second contact electrode CTE2 may be bent from the lower side of the first portion thereof to extend in the first direction (X-axis direction). The third portion of the second contact electrode CTE2 may be bent from the right side of the second portion thereof to extend in the second direction (Y-axis direction) and may be disposed on the first electrode RME1.

The second contact electrode CTE2 may be connected between the other ends of the first light emitting elements ED1 and one ends of the second light emitting elements ED2. The second contact electrode CTE2 may correspond to the third node N3 of FIG. 4. The second contact electrode CTE2 may correspond to a cathode electrode of the first light emitting elements ED1, but is not limited thereto. The second contact electrode CTE2 may correspond to an anode electrode of the second light emitting elements ED2, but is not limited thereto.

The third contact electrode CTE3 may be disposed on the third electrode RME3, and may be electrically connected to the third electrode RME3 through a forty-sixth contact hole CNT46. The third contact electrode CTE3 may be connected between the other ends of the second light emitting elements ED2 and the third electrode RME3. The third contact electrode CTE3 may correspond to a cathode electrode of the second light emitting elements ED2, but is not limited thereto. The third contact electrode CTE3 may receive the low potential voltage through the third electrode RME3.

Figure 11:
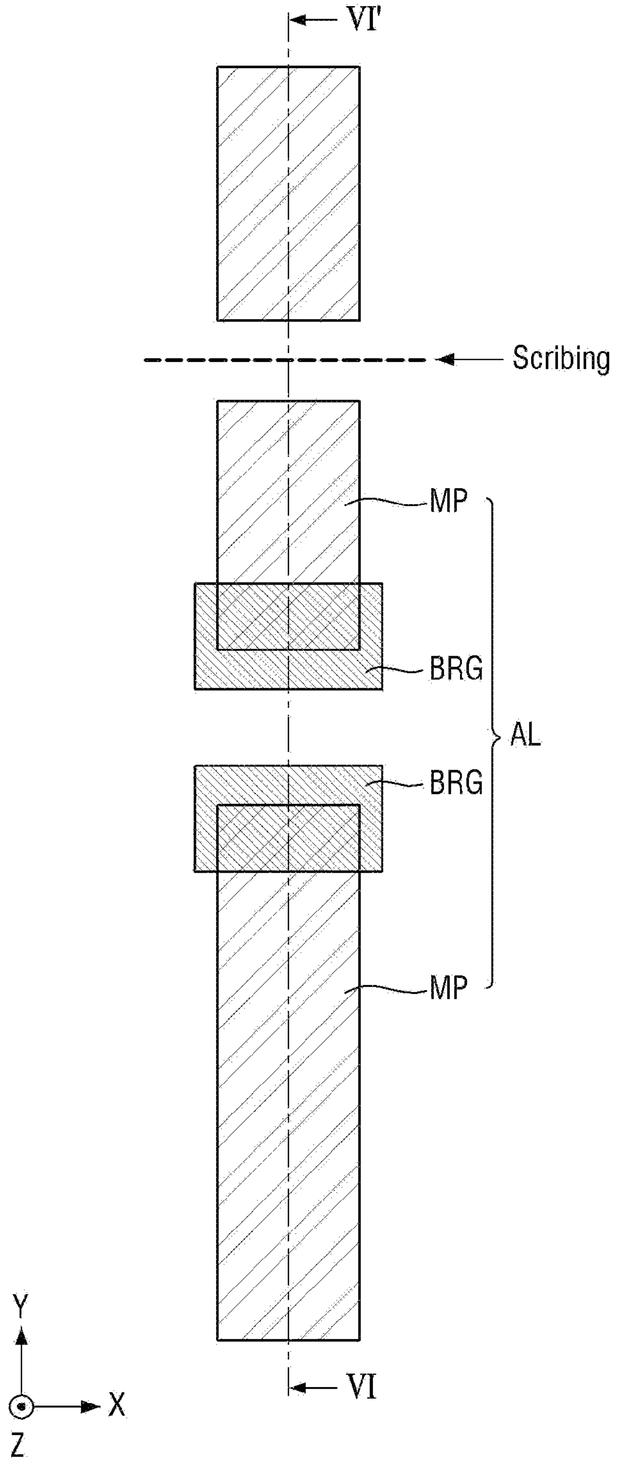
FIG. 11 is a plan view showing an alignment line of a display device according to one embodiment.
Figure 12:
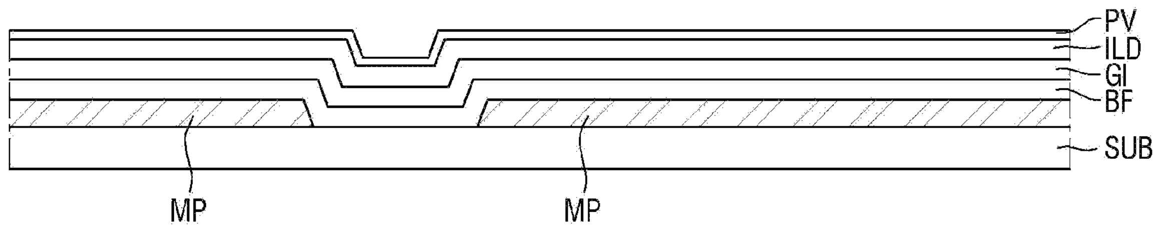
FIGS. 12 to 15 are schematic cross-sectional views showing an example of a manufacturing process of the alignment line of FIG. 11.
Figure 13:
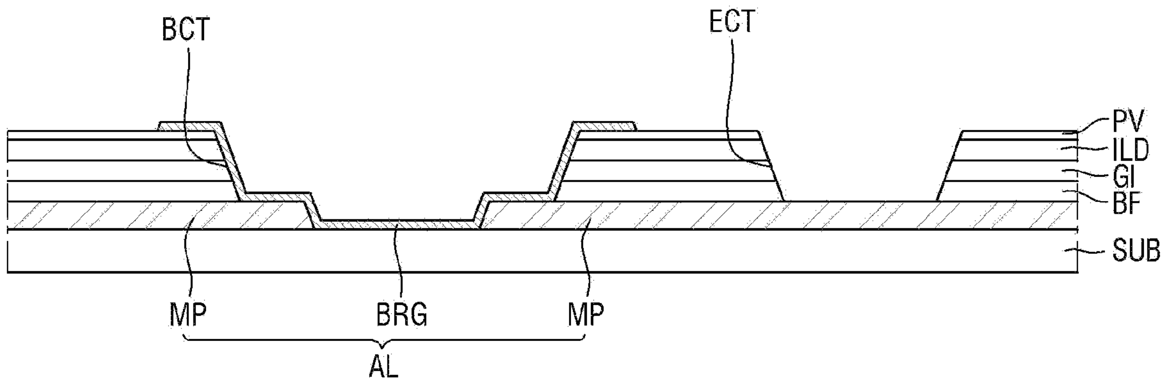
Figure 14:
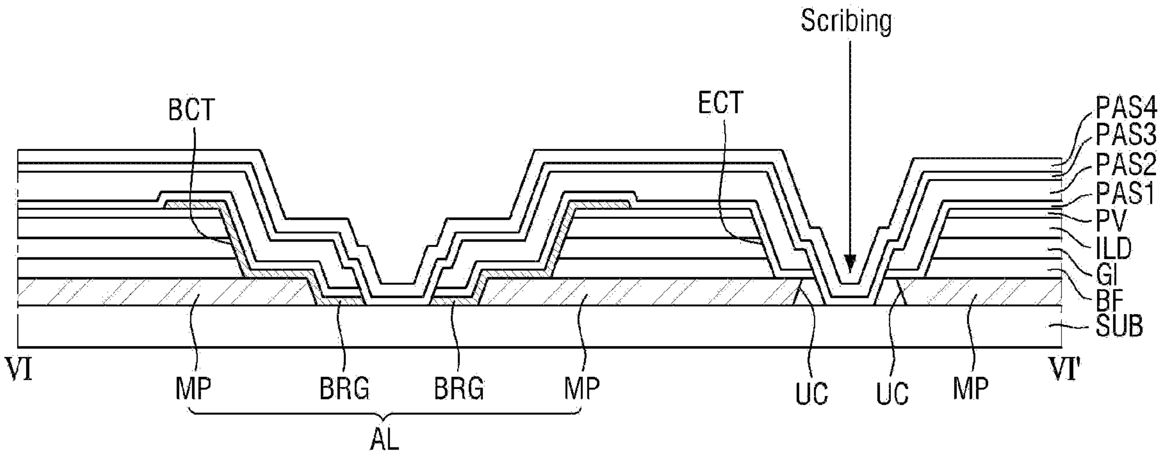

FIG. 11 is a plan view showing an alignment line of a display device according to one embodiment, and FIGS. 12 to 15 are schematic cross-sectional views showing an example of a manufacturing process of the alignment line of FIG. 11. FIG. 14 is an example of a schematic cross-sectional view taken along line VI-VI' of FIG. 11.

Referring to FIGS. 11 to 15, the alignment line AL may be disposed in the non-display area NDA. The alignment line AL may be electrically connected to the alignment electrode of the display area DA. The alignment electrode may include the first to third electrodes RME1, RME2, and RME3 of FIGS. 8 to 10, but is not limited thereto. The alignment line AL may supply an alignment signal to the first to third electrodes RME1, RME2, and RME3 during the alignment process of the light emitting elements ED. The alignment line AL may include a metal pattern MP and a bridge portion (e.g., a cover portion) BRG.

In FIG. 12, the metal pattern MP may be disposed on the substrate SUB. The metal pattern MP may be formed of a same material as the first metal layer MTL1 of the display area DA on a same layer as the first metal layer MTL1. For example, the metal pattern MP may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu). A part of the metal pattern MP may be etched through a wet etching process or a dry etching process, but is not limited thereto.

The buffer layer BF, the gate insulating layer GI, the interlayer insulating layer ILD, and a passivation layer PV may be sequentially stacked each other on the metal pattern MP and the substrate SUB. For example, each of the buffer layer BF, the gate insulating layer GI, the interlayer insulating layer ILD, and the passivation layer PV may include at least one inorganic layer or at least one organic layer.

In FIG. 13, a bridge contact hole BCT and an edge etching portion ECT may be formed to penetrate the passivation layer PV, the interlayer insulating layer ILD, the gate insulating layer GI, and the buffer layer BF. The passivation layer PV, the interlayer insulating layer ILD, the gate insulating layer GI, and the buffer layer BF may be etched through a dry etching process or a wet etching process, but are not limited thereto. The bridge contact hole BCT may overlap a portion in which the metal pattern MP is etched. Accordingly, the portion in which the metal pattern MP is etched may be exposed by the bridge contact hole BCT. The edge etching portion ACT may be formed in a region in which a scribing process is to be performed. The metal pattern MP may be exposed by the edge etching portion ACT.

The bridge portion BRG may be disposed on the passivation layer PV, and may be disposed in the bridge contact hole BCT; the bridge contact hole BCT may be constructed and arranged to electrically connect the metal patterns MP spaced apart from each other. The bridge portion BRG may be formed of a same material as the fourth metal layer MTL4 of the display area DA on a same layer as the fourth metal layer MTL4. For example, the bridge portion BRG may contain at least one of aluminum (Al), silver (Ag), copper (Cu), nickel (Ni), or lanthanum (La). For another example, the bridge portion BRG may include a material such as indium tin oxide (ITO), indium zinc oxide (IZO), and indium tin zinc oxide (ITZO). The bridge portion BRG may have a stacked structure of ITO/Ag/ITO, ITO/Ag/IZO, ITO/Ag/ITZO/IZO, or the like. In still another example, the bridge portion BRG may contain layers including a transparent conductive material layer and a metal layer having high reflectivity, or may include one layer containing a transparent conductive material or a metal having high reflectivity.

The alignment line AL may be electrically connected to the first to third electrodes RME1, RME2, and RME3 of the display area DA. The alignment line AL may receive an alignment signal from the outside during the manufacturing process of the display device 10 and supply it to the first to third electrodes RME1, RME2, and RME3. The first to third electrodes RME1, RME2, and RME3 may receive the alignment signal, and an electric field may be formed between the first to third electrodes RME1, RME2, and RME3. The light emitting elements ED may be injected onto the first to third electrodes RME1, RME2, and RME3 through an inkjet printing process. The injected light emitting elements ED may be aligned by receiving a dielectrophoretic force exerted by the electric field formed between the first to third electrodes RME1, RME2, and RME3.

In FIG. 14, the first insulating layer PAS1 and the second insulating layer PAS2 may be sequentially stacked each other on the passivation layer PV, the bridge portion BRG, and the metal pattern MP. For example, each of the first and second insulating layers PAS1 and PAS2 may include at least one inorganic layer or at least one organic layer.

After the completion of the alignment process of the light emitting elements ED, the first and second insulating layers PAS1 and PAS2, the bridge portion BRG, and the metal pattern MP may be etched. For example, the first and second insulating layers PAS1 and PAS2 may be etched through a dry etching process, and the bridge portion BRG and the metal pattern MP may be etched through a wet etching process, but are not limited thereto. The bridge portion BRG may be etched in the same process as the separation portion ROP shown in FIG. 8. Accordingly, after the completion of the alignment process of the light emitting elements ED, the first to third electrodes RME1, RME2, and RME3 may be separated on a row basis by the separation portion ROP, and the bridge portion BRG may be etched to insulate the metal patterns MP spaced apart from each other.

The metal pattern MP may be etched in a region overlapping the edge etching portion ACT. The thickness of the metal pattern MP may be larger than the thickness of the bridge portion BRG. In case that the metal pattern MP is etched through a wet etching process, the metal pattern MP may include an undercut UC. The etching area of the metal pattern MP may be larger than the etching area of the first and second insulating layers PAS1 and PAS2, and the lower portion of the metal pattern MP may be etched more than the upper portion thereof due to the undercut UC.

The third insulating layer PAS3 and a fourth insulating layer PAS4 may be sequentially stacked each other on the second insulating layer PAS2 and the substrate SUB. For example, each of the third and fourth insulating layers PAS3 and PAS4 may include at least one inorganic layer or at least one organic layer. The third and fourth insulating layers PAS3 and PAS4 may cover the top surface of the substrate SUB exposed as a result of the bridge portion BRG being etched and the top surface of the substrate SUB exposed as a result of the metal pattern MP being etched. The third insulating layer PAS3 may be spaced apart from the metal pattern MP due to the undercut UC of the metal pattern MP. Accordingly, an empty space surrounded by the substrate SUB, the metal pattern MP, the first and third insulating layers PAS1 and PAS3 may be formed.

Figure 15:
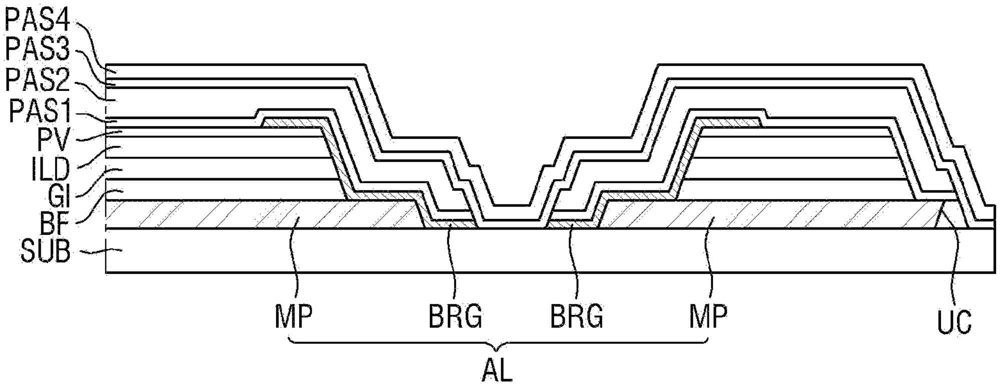

In FIG. 15, the substrate SUB, and the third and fourth insulating layers PAS3 and PAS4 may be cut by a scribing process. The size of the display panel 100 may be determined through the scribing process and a grinding process. A schematic cross-sectional view of FIG. may correspond to an example of the cross section of the non-display area NDA of FIG. 2.

The display device 10 includes the bridge portion BRG electrically connecting the metal patterns MP, so that corrosion of the alignment line AL can be blocked or prevented even in case that the undercut UC of the metal pattern MP occurs at the edge of the display panel 100. As the bridge portion BRG is etched after the completion of the alignment process of the light emitting elements ED, corrosion of the alignment line AL may be blocked or prevented.

Figure 16:
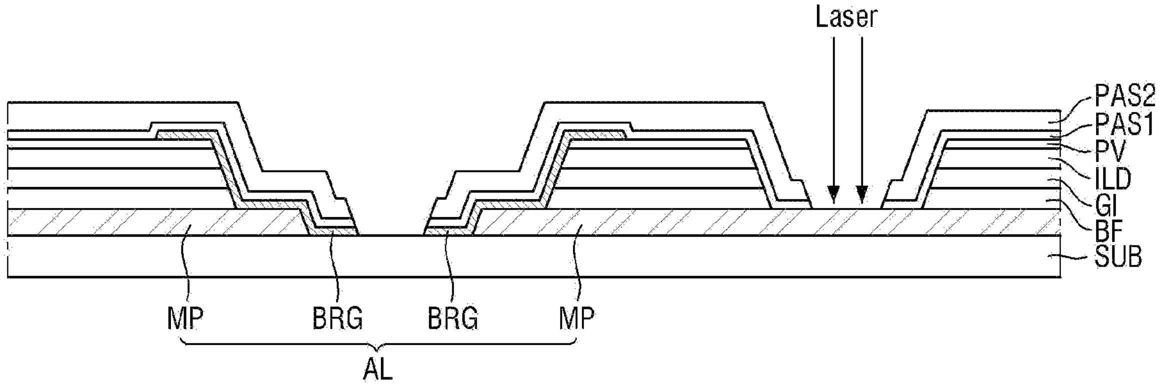
FIGS. 16 to 19 are schematic cross-sectional views illustrating another example of the manufacturing process of the alignment line of FIG. 11.
Figure 17:
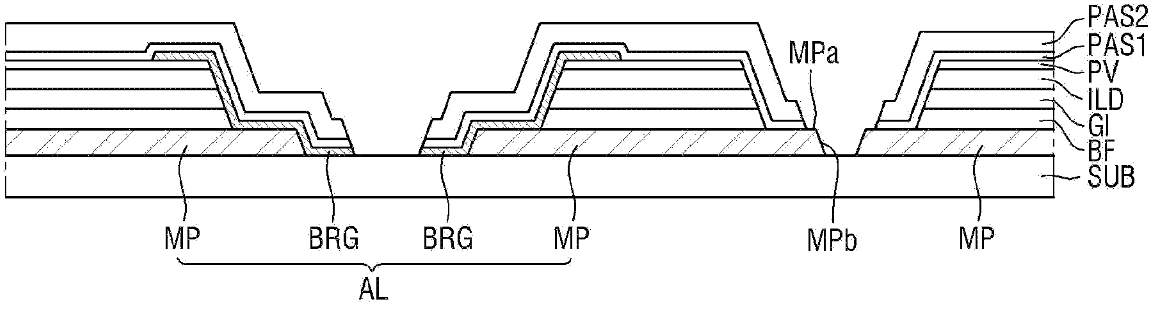
Figure 18:
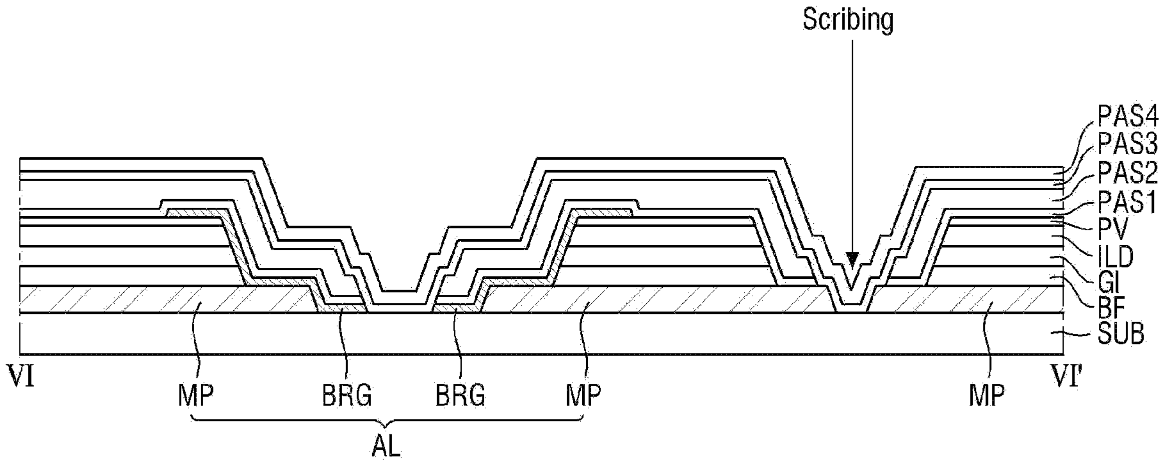

FIGS. 16 to 19 are schematic cross-sectional views illustrating another example of the manufacturing process of the alignment line of FIG. 11. FIG. 16 illustrates a manufacturing process after the alignment of the light emitting elements ED is completed by the alignment line AL shown in FIG. 13. FIG. 18 is another example of a schematic cross-sectional view taken along line VI-VI' of FIG. 11.

In FIGS. 16 and 17, the first insulating layer PAS1 and the second insulating layer PAS2 may be sequentially stacked each other on the passivation layer PV, the bridge portion BRG, and the metal pattern MP. For example, each of the first and second insulating layers PAS1 and PAS2 may include at least one inorganic layer or at least one organic layer.

Upon the completion of the alignment process of the light emitting elements D, the first and second insulating layers PAS1 and PAS2 and the bridge portion BRG may be etched. For example, the first and second insulating layers PAS1 and PAS2 may be etched through a dry etching process, and the bridge portion BRG may be etched through a wet etching process, but are not limited thereto. The bridge portion BRG may be etched in the same process as the separation portion ROP shown in FIG. 8. Accordingly, after the alignment process of the light emitting elements ED is completed, the first to third electrodes RME1, RME2, and RME3 may be separated on a row basis by the separation portion ROP, and the bridge portion BRG may be cut to insulate the metal patterns MP spaced apart from each other.

The metal pattern MP may be etched in a region overlapping the edge etching portion ACT. The thickness of the metal pattern MP may be larger than the thickness of the bridge portion BRG. By way of example, the metal pattern MP may be etched through a laser etching process, so the metal pattern MP may not have the undercut UC of FIG. 14. The etching area of the metal pattern MP may be smaller than the etching area of the first and second insulating layers PAS1 and PAS2, and the upper portion of the metal pattern MP may be etched more than the lower portion thereof. Accordingly, a top surface MPa and a side surface MPb of the metal pattern MP may be exposed without being covered by the first and second insulating layers PAS1 and PAS2.

In FIG. 18, the third insulating layer PAS3 and the fourth insulating layer PAS4 may be sequentially stacked each other on the second insulating layer PAS2, the metal pattern MP, and the substrate SUB. For example, each of the third and fourth insulating layers PAS3 and PAS4 may include at least one inorganic layer or at least one organic layer. The third and fourth insulating layers PAS3 and PAS4 may cover the top surface of the substrate SUB exposed as a result of the bridge portion BRG being etched and the top surface of the substrate SUB exposed as a result of the metal pattern MP being etched. The third insulating layer PAS3 may cover the top surface MPa and the side surface MPb of the metal pattern MP. Accordingly, the empty space shown in FIG. 14 may not be formed in the display panel 100 of FIG. 18.

Figure 19:
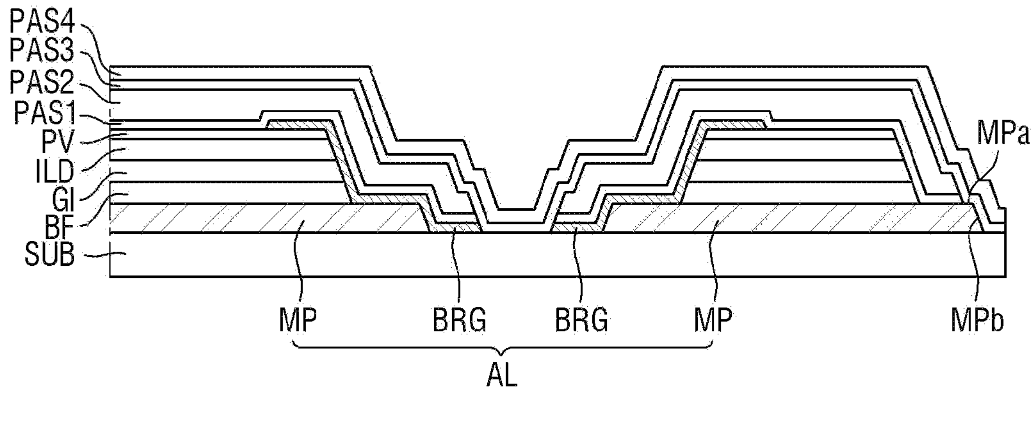

In FIG. 19, the substrate SUB, the third and fourth insulating layers PAS3 and PAS4 may be cut by a scribing process. The size of the display panel 100 may be determined through the scribing process and a grinding process. A schematic cross-sectional view of FIG. 19 may correspond to another example of the cross section of the non-display area NDA of FIG. 2.

In the display device 10, the metal pattern MP may be etched in a region in which the scribing process is to be performed through a laser etching process. Accordingly, the undercut UC of the metal pattern MP may not occur at the edge of the display panel 100, and corrosion of the alignment line AL may be blocked or prevented. As the bridge portion BRG is etched after the completion of the alignment process of the light emitting elements ED, corrosion of the alignment line AL may be blocked or prevented.

Figure 20:
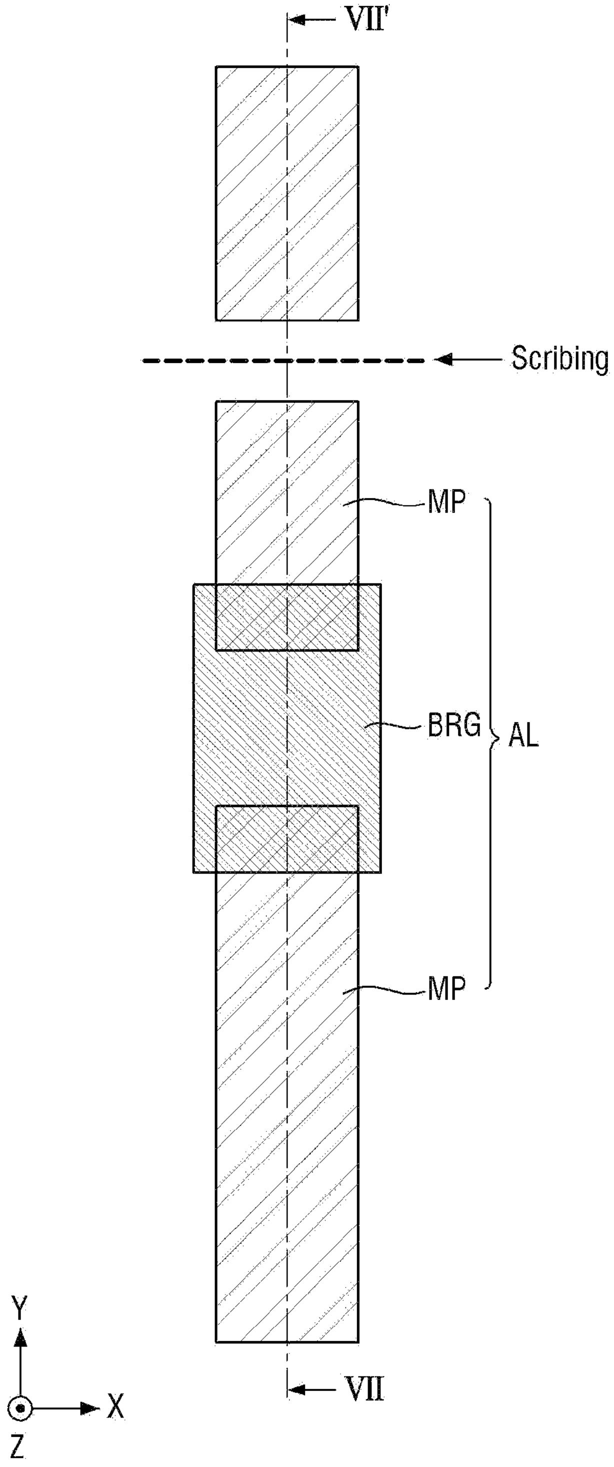
FIG. 20 is a plan view showing an alignment line of a display device according to another embodiment.
Figure 21:
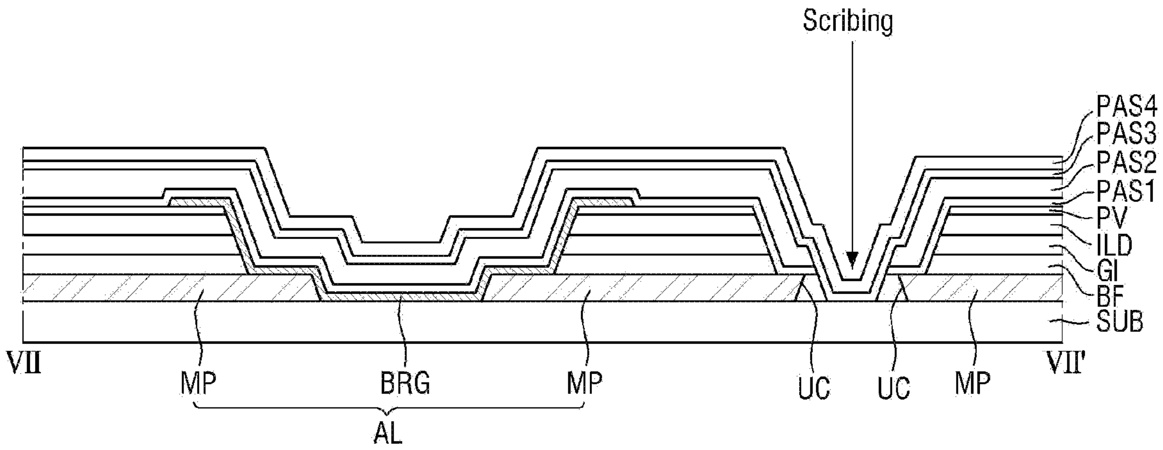
FIGS. 21 and 22 are schematic cross-sectional views showing a manufacturing process of the alignment line of FIG. 20.
Figure 22:
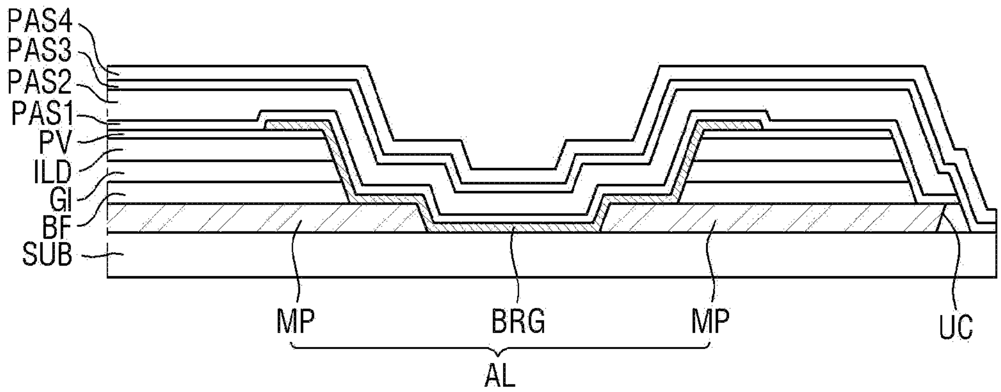

FIG. 20 is a plan view showing an alignment line of a display device according to another embodiment, and FIGS. 21 and 22 are schematic cross-sectional views showing a manufacturing process of the alignment line of FIG. 20. FIG. 21 illustrates a manufacturing process after the completion of the alignment of the light emitting elements ED by the alignment line AL shown in FIG. 13. FIG. 21 is a schematic cross-sectional view taken along line VII-VII' of FIG. 20.

Referring to FIGS. 20 to 22, the alignment line AL may be disposed in the non-display area NDA. The alignment line AL may supply an alignment signal to the first to third electrodes RME1, RME2, and RME3 during the alignment process of the light emitting elements ED. The alignment line AL may include a metal pattern MP and a bridge portion BRG.

In FIG. 21, the first insulating layer PAS1 and the second insulating layer PAS2 may be sequentially stacked each other on the passivation layer PV, the bridge portion BRG, and the metal pattern MP. For example, each of the first and second insulating layers PAS1 and PAS2 may include at least one inorganic layer or at least one organic layer.

After the completion of the alignment process of the light emitting elements ED, the first and second insulating layers PAS1 and PAS2 and the metal pattern MP may be etched. For example, the first and second insulating layers PAS1 and PAS2 may be etched through a dry etching process, and the metal pattern MP may be etched through a wet etching process, but are not limited thereto.

The metal pattern MP may be etched in a region overlapping the edge etching portion ACT. The thickness of the metal pattern MP may be larger than the thickness of the bridge portion BRG. In case that the metal pattern MP is etched through a wet etching process, the metal pattern MP may include the undercut UC. The etching area of the metal pattern MP may be larger than the etching area of the first and second insulating layers PAS1 and PAS2, and the lower portion of the metal pattern MP may be etched more than the upper portion thereof due to the undercut UC.

The third insulating layer PAS3 and a fourth insulating layer PAS4 may be sequentially stacked each other on the second insulating layer PAS2 and the substrate SUB. For example, each of the third and fourth insulating layers PAS3 and PAS4 may include at least one inorganic layer or at least one organic layer. The third and fourth insulating layers PAS3 and PAS4 may cover the top surface of the substrate SUB that is exposed as a result of the metal pattern MP being etched. The third insulating layer PAS3 may be spaced apart from the metal pattern MP due to the undercut UC of the metal pattern MP. Accordingly, an empty space surrounded by the substrate SUB, the metal pattern MP, the first and third insulating layers PAS1 and PAS3 may be formed.

In FIG. 22, the substrate SUB, and the third and fourth insulating layers PAS3 and PAS4 may be cut by a scribing process. The size of the display panel 100 may be determined through the scribing process and a grinding process. A schematic cross-sectional view of FIG. 22 may correspond to yet another example of the cross section of the non-display area NDA of FIG. 2.

The display device 10 includes the bridge portion BRG that electrically connects the metal patterns MP, so that corrosion of the alignment line AL can be blocked or prevented even in case that the undercut UC of the metal pattern MP occurs at the edge of the display panel 100. The bridge portion BRG may be disposed in the bridge contact hole BCT, the bridge contact hole BCT constructed and arranged to cause the bridge portion BRG and the metal pattern MP to be electrically connected to each other. The contact structure through the bridge contact hole BCT may prevent permeation and diffusion of moisture, and may block or prevent corrosion of the alignment line AL.

Figure 23:
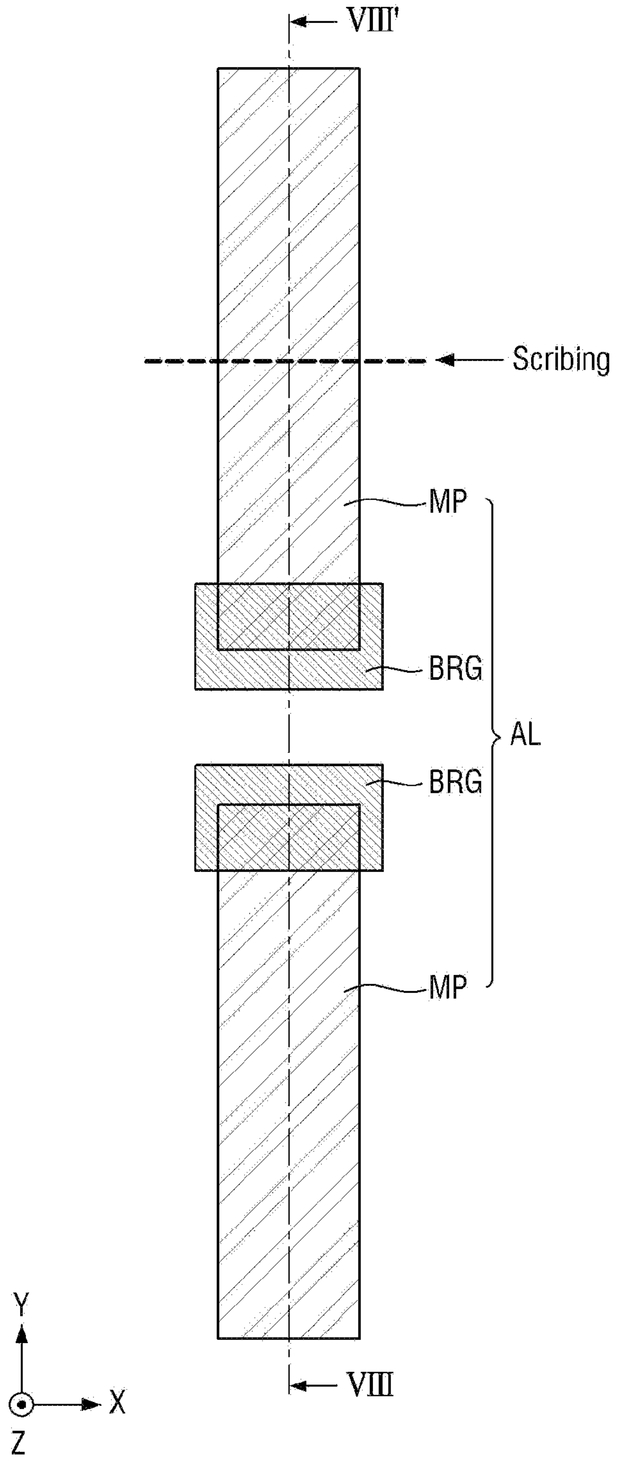
FIG. 23 is a plan view showing an alignment line of a display device according to another embodiment.
Figure 24:
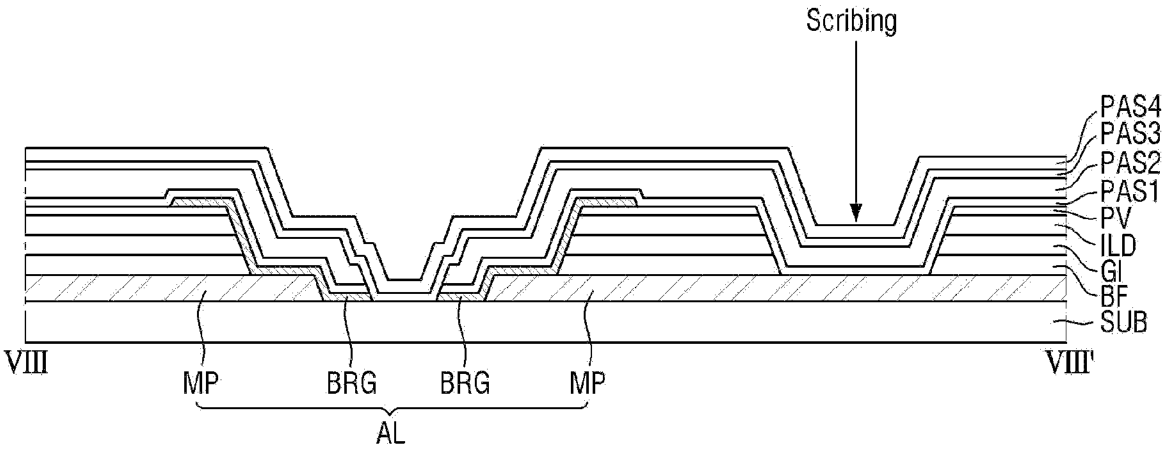
FIGS. 24 and 25 are schematic cross-sectional views showing a manufacturing process of the alignment line of FIG. 23.
Figure 25:
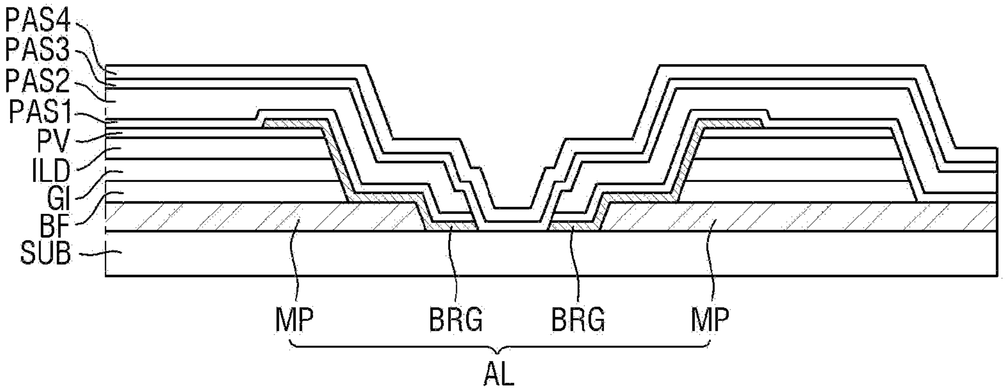

FIG. 23 is a plan view showing an alignment line of a display device according to another embodiment, and FIGS. 24 and 25 are schematic cross-sectional views showing a manufacturing process of the alignment line of FIG. 23. FIG. 24 illustrates a manufacturing process after the completion of the alignment of the light emitting elements ED by the alignment line AL shown in FIG. 13. FIG. 24 is a schematic cross-sectional view taken along line VIII-VIII' of FIG. 23.

Referring to FIGS. 23 to 25, the alignment line AL may be disposed in the non-display area NDA. The alignment line AL may supply an alignment signal to the first to third electrodes RME1, RME2, and RME3 during the alignment process of the light emitting elements ED. The alignment line AL may include a metal pattern MP and a bridge portion BRG.

In FIG. 24, the first insulating layer PAS1 and the second insulating layer PAS2 may be sequentially stacked each other on the passivation layer PV, the bridge portion BRG, and the metal pattern MP. For example, each of the first and second insulating layers PAS1 and PAS2 may include at least one inorganic layer or at least one organic layer.

Upon the completion of the alignment process of the light emitting elements D, the first and second insulating layers PAS1 and PAS2 and the bridge portion BRG may be etched. For example, the first and second insulating layers PAS1 and PAS2 may be etched through a dry etching process, and the bridge portion BRG may be etched through a wet etching process, but are not limited thereto. The bridge portion BRG may be etched in the same process as the separation portion ROP shown in FIG. 8. Accordingly, after the completion of the alignment process of the light emitting elements ED, the first to third electrodes RME1, RME2, and RME3 may be separated on a row basis by the separation portion ROP, and the bridge portion BRG may be etched to insulate the metal patterns MP spaced apart from each other.

The third insulating layer PAS3 and a fourth insulating layer PAS4 may be sequentially stacked each other on the second insulating layer PAS2 and the substrate SUB. For example, each of the third and fourth insulating layers PAS3 and PAS4 may include at least one inorganic layer or at least one organic layer. The third and fourth insulating layers PAS3 and PAS4 may cover the top surface of the substrate SUB that is exposed as a result of the bridge portion BRG being etched.

In FIG. 25, the substrate SUB, the metal pattern MP, and the first to fourth insulating layers PAS1, PAS2, PAS3, and PAS4 may be cut by a scribing process. The size of the display panel 100 may be determined through the scribing process and a grinding process. A schematic cross-sectional view of FIG. 25 may correspond to yet another example of the cross section of the non-display area NDA of FIG. 2.

The display device 10 includes the bridge portion BRG that electrically connects the metal pattern MP, so that corrosion of the alignment line AL can be blocked or prevented even in case that the metal pattern MP is exposed from the side of the display panel 100. As the bridge portion BRG is etched after the completion of the alignment process of the light emitting elements ED, corrosion of the alignment line AL may be blocked or prevented.

Figure 26:
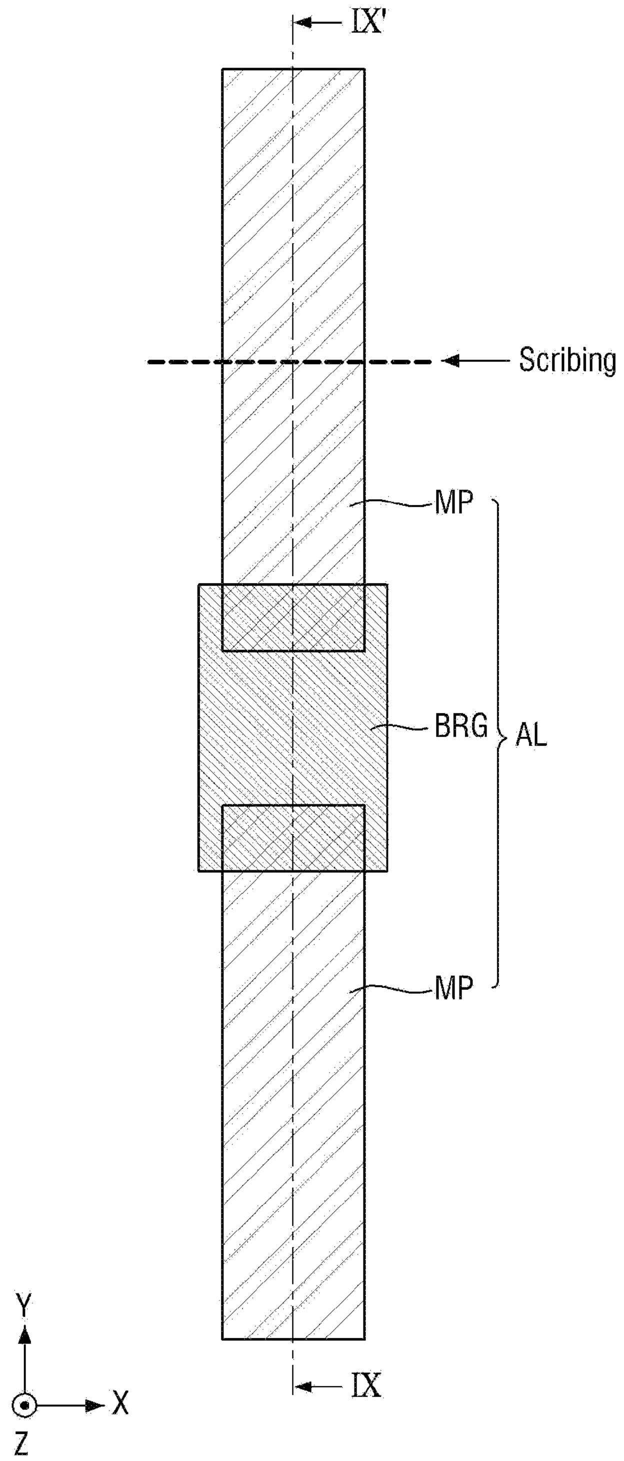
FIG. 26 is a plan view showing an alignment line of a display device according to still another embodiment.
Figure 27:
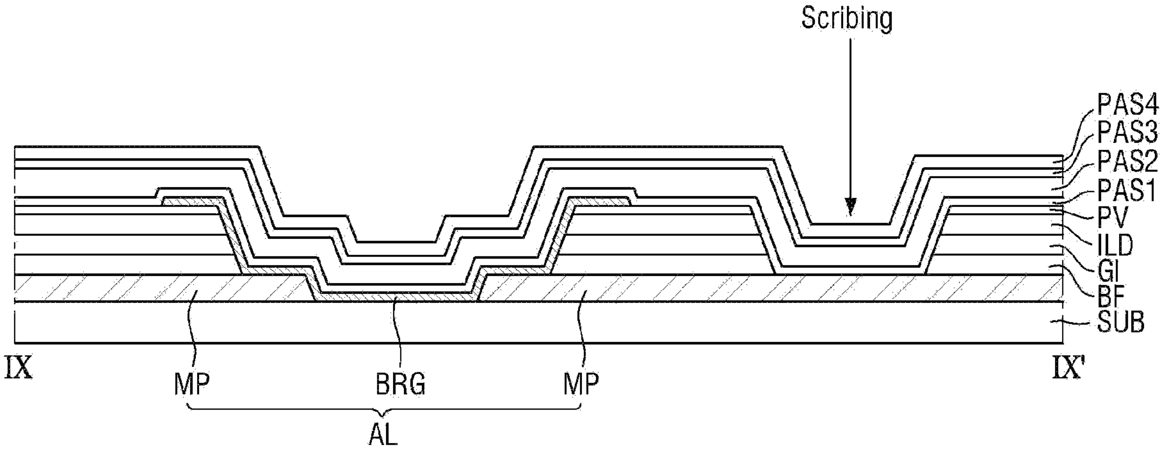
FIGS. 27 and 28 are schematic cross-sectional views showing a manufacturing process of the alignment line of FIG. 26.
Figure 28:
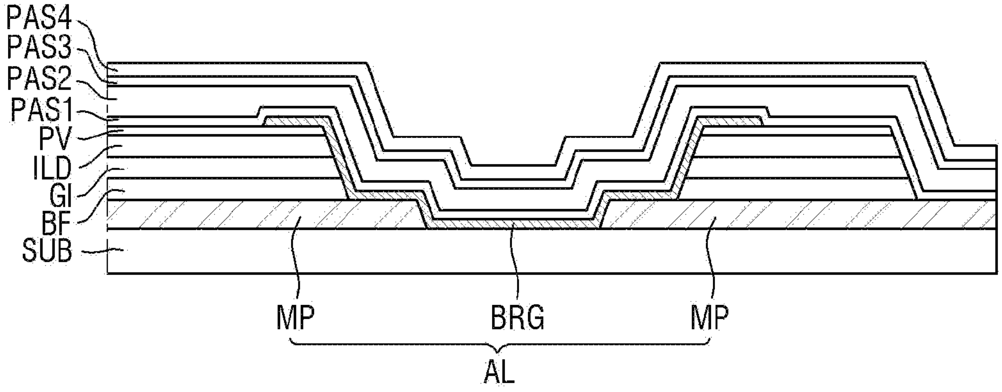

FIG. 26 is a plan view showing an alignment line of a display device according to still another embodiment, and FIGS. 27 and 28 are schematic cross-sectional views showing a manufacturing process of the alignment line of FIG. 26. FIG. 27 illustrates a manufacturing process after the completion of the alignment of the light emitting elements ED by the alignment line AL shown in FIG. 13. FIG. 27 is a schematic cross-sectional view taken along line IX-IX' of FIG. 26.

Referring to FIGS. 26 to 28, the alignment line AL may be disposed in the non-display area NDA. The alignment line AL may supply an alignment signal to the first to third electrodes RME1, RME2, and RME3 during the alignment process of the light emitting elements ED. The alignment line AL may include a metal pattern MP and a bridge portion BRG.

In FIG. 27, the first to fourth insulating layers PAS1, PAS2, PAS3, and PAS4 may be sequentially stacked each other on the passivation layer PV, the bridge portion BRG, and the metal pattern MP. For example, each of the first to fourth insulating layers PAS1, PAS2, PAS3, and PAS4 may include at least one inorganic layer or at least one organic layer.

In FIG. 28, the substrate SUB, the metal pattern MP, and the first to fourth insulating layers PAS1, PAS2, PAS3, and PAS4 may be cut by a scribing process. The size of the display panel 100 may be determined through the scribing process and a grinding process. A schematic cross-sectional view of FIG. 28 may correspond to yet another example of the cross section of the non-display area NDA of FIG. 2.

The display device 10 includes the bridge portion BRG that electrically connects the metal pattern MP, so that corrosion of the alignment line AL can be blocked or prevented even in case that the metal pattern MP is exposed from the side of the display panel 100. The bridge portion BRG may be disposed in the bridge contact hole BCT, the bridge contact hole BCT constructed and arranged to electrically connect the bridge portion BRG with the metal pattern MP. The contact structure through the bridge contact hole BCT may prevent permeation and diffusion of moisture, and may block or prevent corrosion of the alignment line AL.

Figure 29:
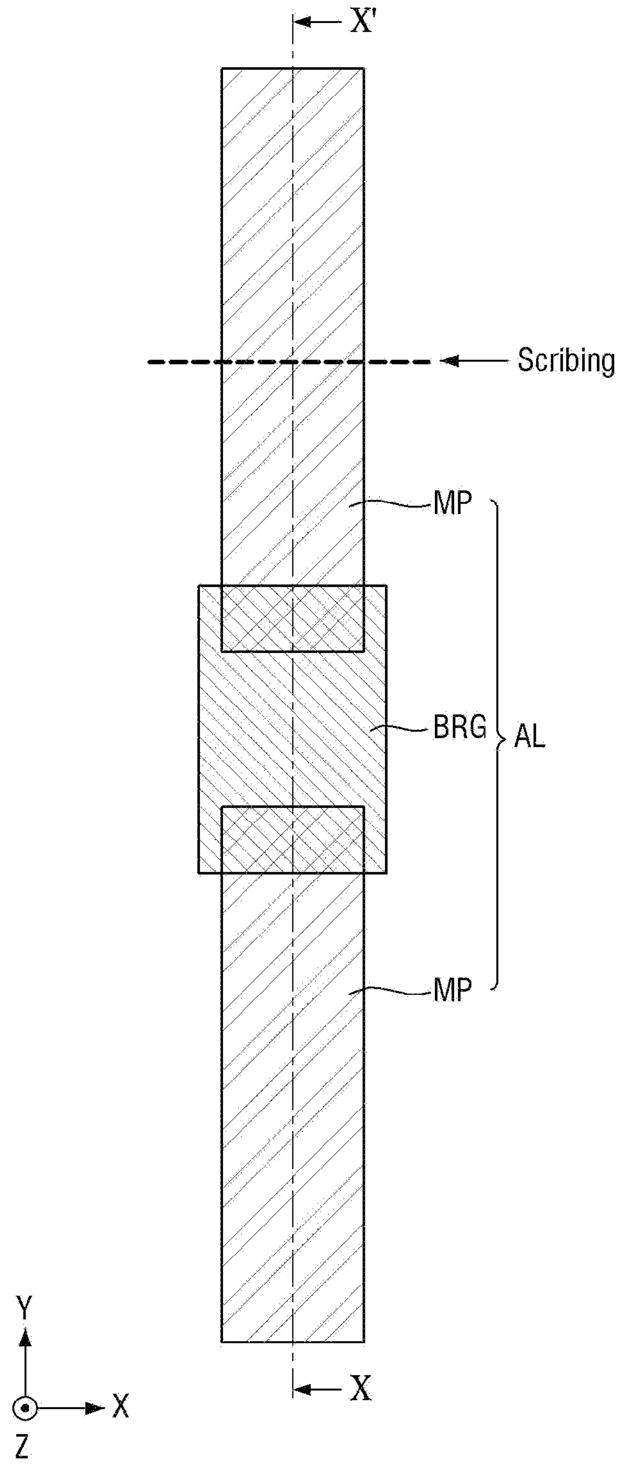
FIG. 29 is a plan view showing an alignment line of a display device according to still another embodiment.
Figure 30:
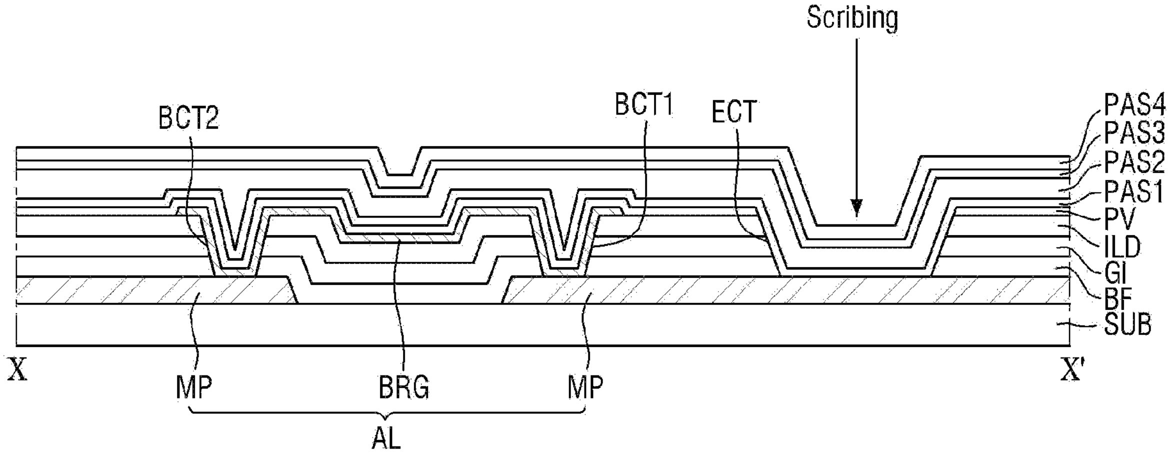
FIGS. 30 and 31 are schematic cross-sectional views showing a manufacturing process of the alignment line of FIG. 29.
Figure 31:
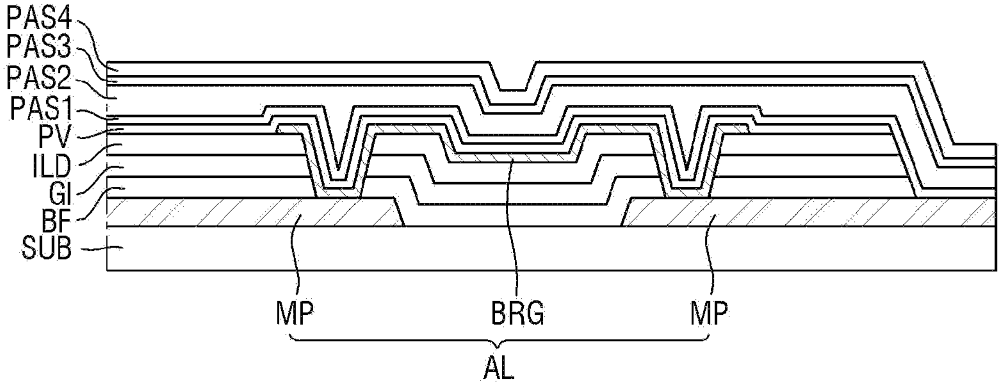

FIG. 29 is a plan view showing an alignment line of a display device according to still another embodiment, and FIGS. 30 and 31 are schematic cross-sectional views showing a manufacturing process of the alignment line of FIG. 29. FIG. 30 is a schematic cross-sectional view taken along line X-X' in FIG. 29.

Referring to FIGS. 29 to 31, the alignment line AL may be disposed in the non-display area NDA. The alignment line AL may supply an alignment signal to the first to third electrodes RME1, RME2, and RME3 during the alignment process of the light emitting elements ED. The alignment line AL may include a metal pattern MP and a bridge portion BRG.

In FIG. 30, the metal pattern MP may be disposed on the substrate SUB. The metal pattern MP may be formed of a same material as the first metal layer MTL1 of the display area DA on a same layer as the first metal layer MTL1. The buffer layer BF, the gate insulating layer GI, and the interlayer insulating layer ILD may be sequentially stacked each other on the metal pattern MP and the substrate SUB. For example, each of the buffer layer BF, the gate insulating layer GI, and the interlayer insulating layer ILD may include at least one inorganic layer or at least one organic layer.

The first and second bridge contact holes BCT1 and BCT2 may be formed to penetrate the interlayer insulating layer ILD, the gate insulating layer GI, and the buffer layer BF to expose the top surface of the metal pattern MP. The bridge portion BRG may be disposed on the interlayer insulating layer ILD and may be disposed in each of the first and second bridge contact holes BCT1 and BCT2. The bridge portion BRG may be disposed in the first bridge contact hole BCT1 that provides the bridge portion BRG with an electrical connection with the metal pattern MP adjacent to the edge of the display panel 100; the bridge portion BRG may be disposed in the second bridge contact hole BCT2 that provides the bridge portion BRG with an electrical connection with the metal pattern MP adjacent to the display area DA. The bridge portion BRG may be constructed and arranged to electrically connect the metal patterns MP spaced apart from each other. The bridge portion BRG may be formed of a same material as the third metal layer MTL3 of the display area DA on a same layer as the third metal layer MTL3. For example, the bridge portion BRG may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The passivation layer PV may be disposed on the bridge portion BRG and the interlayer insulating layer ILD. The edge etching portion ECT may be formed to penetrate the passivation layer PV, the interlayer insulating layer ILD, the gate insulating layer GI, and the buffer layer BF. The passivation layer PV, the interlayer insulating layer ILD, the gate insulating layer GI, and the buffer layer BF may be etched through a dry etching process or a wet etching process, but are not limited thereto. The edge etching portion ACT may be formed in a region in which a scribing process is to be performed.

The alignment line AL may be electrically connected to the first to third electrodes RME1, RME2, and RME3 of the display area DA. The alignment line AL may receive an alignment signal from the outside during the manufacturing process of the display device 10 and supply it to the first to third electrodes RME1, RME2, and RME3. The first to third electrodes RME1, RME2, and RME3 may receive the alignment signal, and an electric field may be formed between the first to third electrodes RME1, RME2, and RME3. The multiple light emitting elements ED may be injected onto the first to third electrodes RME1, RME2, and RME3 through an inkjet printing process. The injected light emitting elements ED may be aligned by receiving a dielectrophoretic force exerted by the electric field formed between the first to third electrodes RME1, RME2, and RME3.

The first to fourth insulating layers PAS1, PAS2, PAS3, and PAS4 may be sequentially stacked each other on the passivation layer PV and the metal pattern MP. For example, each of the first to fourth insulating layers PAS1, PAS2, PAS3, and PAS4 may include at least one inorganic layer or at least one organic layer.

In FIG. 31, the substrate SUB, the metal pattern MP, and the first to fourth insulating layers PAS1, PAS2, PAS3, and PAS4 may be cut by a scribing process. The size of the display panel 100 may be determined through the scribing process and a grinding process. A schematic cross-sectional view of FIG. 31 may correspond to yet another example of the cross section of the non-display area NDA of FIG. 2.

The display device 10 includes the bridge portion BRG that electrically connects the metal pattern MP, so that corrosion of the alignment line AL can be blocked or prevented even in case that the metal pattern MP is exposed from the side of the display panel 100. The bridge portion BRG may be disposed in each of the first and second bridge contact holes BCT1 and BCT2 that electrically connect with the metal patterns MP spaced apart from each other. The contact structure through the first and second bridge contact holes BCT1 and BCT2 may prevent permeation and diffusion of moisture, and may block or prevent corrosion of the alignment line AL.

Figure 32:
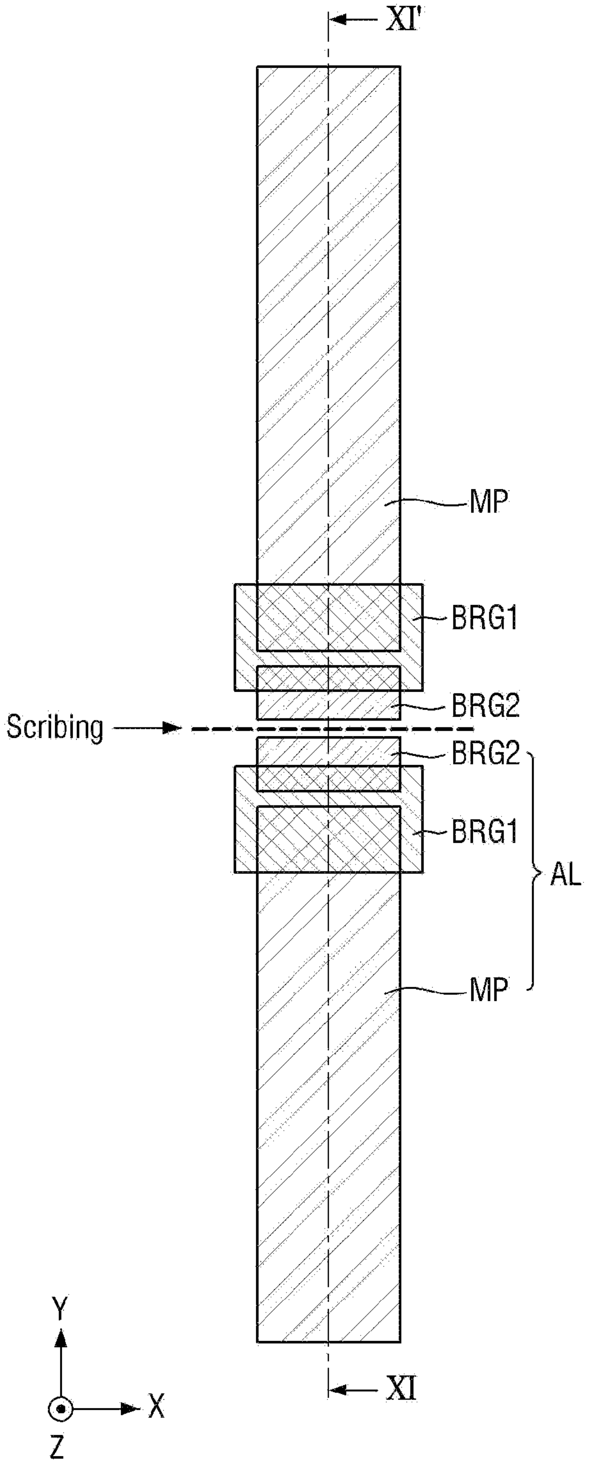
FIG. 32 is a plan view showing an alignment line of a display device according to still another embodiment.
Figure 33:
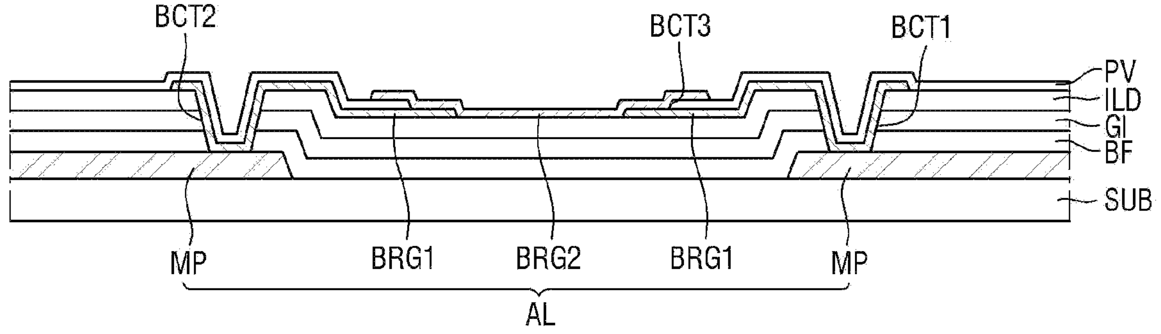
FIGS. 33 to 36 are schematic cross-sectional views showing a manufacturing process of the alignment line of FIG. 32.
Figure 34:
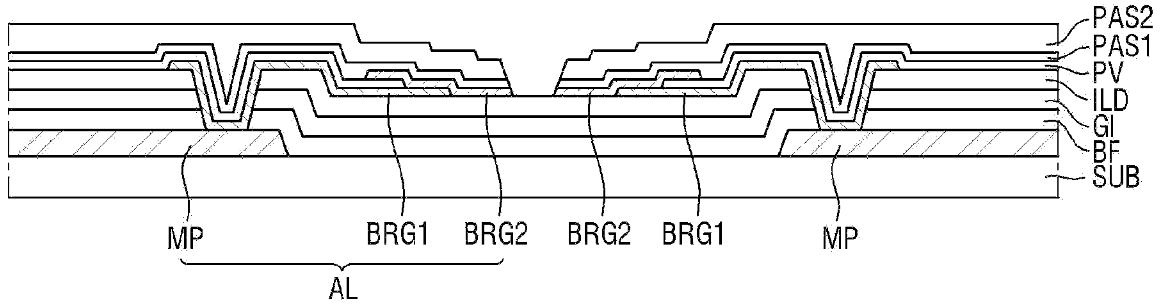
Figure 35:
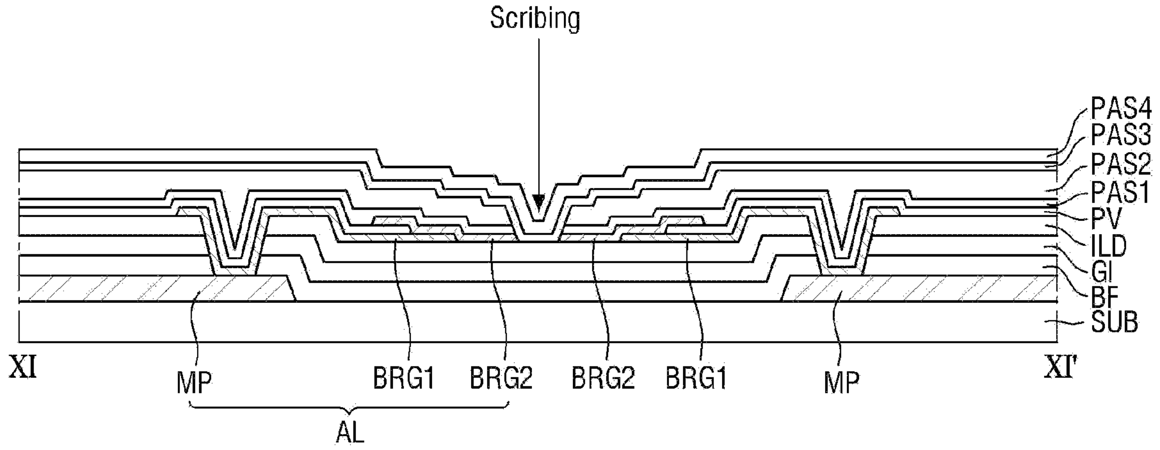

FIG. 32 is a plan view showing an alignment line of a display device according to still another embodiment, and FIGS. 33 to 36 are schematic cross-sectional views showing a manufacturing process of the alignment line of FIG. 32. FIG. 35 is a schematic cross-sectional view taken along line XI-XI' in FIG. 32.

Referring to FIGS. 32 to 36, the alignment line AL may be disposed in the non-display area NDA. The alignment line AL may supply an alignment signal to the first to third electrodes RME1, RME2, and RME3 during the alignment process of the light emitting elements ED. The alignment line AL may include the metal pattern MP, a first bridge portion BRG1, and a second bridge portion BRG2.

In FIG. 33, the metal pattern MP may be disposed on the substrate SUB. The metal pattern MP may be formed of a same material as the first metal layer MTL1 of the display area DA on a same layer as the first metal layer MTL1. A part of the metal pattern MP may be etched through a wet etching process or a dry etching process, but is not limited thereto.

The buffer layer BF, the gate insulating layer GI, and the interlayer insulating layer ILD may be sequentially stacked each other on the metal pattern MP and the substrate SUB. For example, each of the buffer layer BF, the gate insulating layer GI, and the interlayer insulating layer ILD may include at least one inorganic layer or at least one organic layer.

The first and second bridge contact holes BCT1 and BCT2 may be formed to penetrate the interlayer insulating layer ILD, the gate insulating layer GI, and the buffer layer BF to expose the top surface of the metal pattern MP. The first bridge portion BRG1 may be disposed on the interlayer insulating layer ILD and may be disposed in each of the first and second bridge contact holes BCT1 and BCT2. The first bridge portion BRG1 may be disposed in the first bridge contact hole BCT1 that electrically connects the first bridge portion BRG1 with the metal pattern MP on one side; the first bridge portion BRG1 may be disposed in the second bridge contact hole BCT2 that electrically connects the first bridge portion BRG1 with the metal pattern MP on the other side. The first bridge portion BRG1 may be formed of a same material as the third metal layer MTL3 of the display area DA on a same layer as the third metal layer MTL3. For example, the first bridge portion BRG1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The passivation layer PV may be disposed on the first bridge portion BRG1 and the interlayer insulating layer ILD. A third bridge contact hole BCT3 may be formed to penetrate the passivation layer PV, and may expose the top surface of the first bridge portion BRG1. The third bridge contact hole BCT3 may be formed in a region in which a scribing process is to be performed. The first bridge portion BRG1 exposed by the third bridge contact hole BCT3 may be etched. The first bridge portion BRG1 may be etched through a wet etching process or a dry etching process, but is not limited thereto.

The second bridge portion BRG2 may be disposed on the passivation layer PV, and may be disposed in the third bridge contact hole BCT3 that electrically connects the second bridge portion BRG2 with the first bridge portions BRG1 spaced apart from each other. Accordingly, the metal patterns MP spaced apart from each other may be electrically connected to each other by the first and second bridge portions BRG1 and BRG2. The second bridge portion BRG2 may be formed of a same material as the fourth metal layer MTL4 of the display area DA on a same layer as the fourth metal layer MTL4. For example, the second bridge portion BRG2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The alignment line AL may be electrically connected to the first to third electrodes RME1, RME2, and RME3 of the display area DA. The alignment line AL may receive an alignment signal from the outside during the manufacturing process of the display device 10 and supply it to the first to third electrodes RME1, RME2, and RME3. The first to third electrodes RME1, RME2, and RME3 may receive the alignment signal, and an electric field may be formed between the first to third electrodes RME1, RME2, and RME3. The light emitting elements ED may be injected onto the first to third electrodes RME1, RME2, and RME3 through an inkjet printing process. The injected light emitting elements ED may be aligned by receiving a dielectrophoretic force exerted by the electric field formed between the first to third electrodes RME1, RME2, and RME3.

In FIG. 34, the first insulating layer PAS1 and the second insulating layer PAS2 may be sequentially stacked each other on the passivation layer PV and the second bridge portion BRG2. For example, each of the first and second insulating layers PAS1 and PAS2 may include at least one inorganic layer or at least one organic layer.

After the completion of the alignment process of the light emitting elements ED, the first and second insulating layers PAS1 and PAS2 and the second bridge portion BRG2 may be etched. For example, the first and second insulating films PAS1 and PAS2 may be etched through a dry etching process, and the second bridge portion BRG2 may be etched through a wet etching process, but are not limited thereto. The second bridge portion BRG2 may be etched in the same process as the separation portion ROP shown in FIG. 8. Accordingly, after the alignment process of the light emitting elements ED is completed, the first to third electrodes RME1, RME2, and RME3 may be separated on a row basis by the separation portion ROP, and the second bridge portion BRG2 may be etched to insulate the metal patterns MP separated from each other.

In FIG. 35, the third insulating layer PAS3 and the fourth insulating layer PAS4 may be sequentially stacked each other on the second insulating layer PAS2 and the interlayer insulating layer ILD. For example, each of the third and fourth insulating layers PAS3 and PAS4 may include at least one inorganic layer or at least one organic layer. The third and fourth insulating layers PAS3 and PAS4 may cover the top surface of the interlayer insulating layer ILD that may be exposed as a result of the second bridge portion BRG2 being etched.

Figure 36:
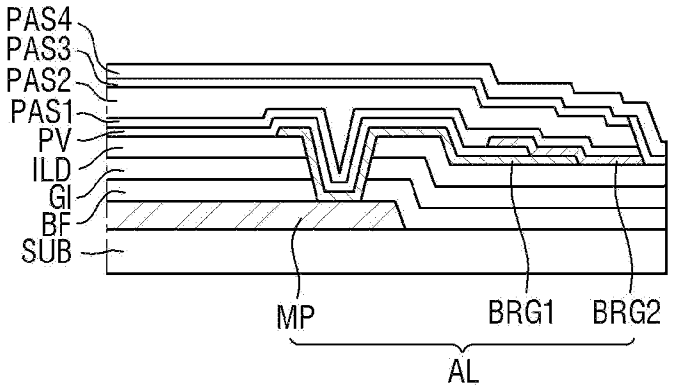

In FIG. 36, the substrate SUB, the buffer layer BF, the gate insulating layer GI, the interlayer insulating layer ILD, and the third and fourth insulating layers PAS3 and PAS4 may be cut by a scribing process. The size of the display panel 100 may be determined through the scribing process and a grinding process. A schematic cross-sectional view of FIG. 36 may correspond to yet another example of the cross section of the non-display area NDA of FIG. 2.

The display device 10 includes the first and second bridge portions BRG1 and BRG2 serving to electrically connect the metal patterns MP, so that corrosion of the alignment line AL may be blocked or prevented. The first bridge portion BRG1 may be disposed in the second bridge contact hole BCT2 that electrically connects the first bridge portion BRG1 with the metal pattern MP, and the second bridge portion BRG2 may be disposed in the third bridge contact hole BCT3 that electrically connects the second bridge portion BRG2 with the first bridge portion BRG1. The contact structure through the second and third bridge contact holes BCT2 and BCT3 may prevent permeation and diffusion of moisture, and may block or prevent corrosion of the alignment line AL.

Figure 37:
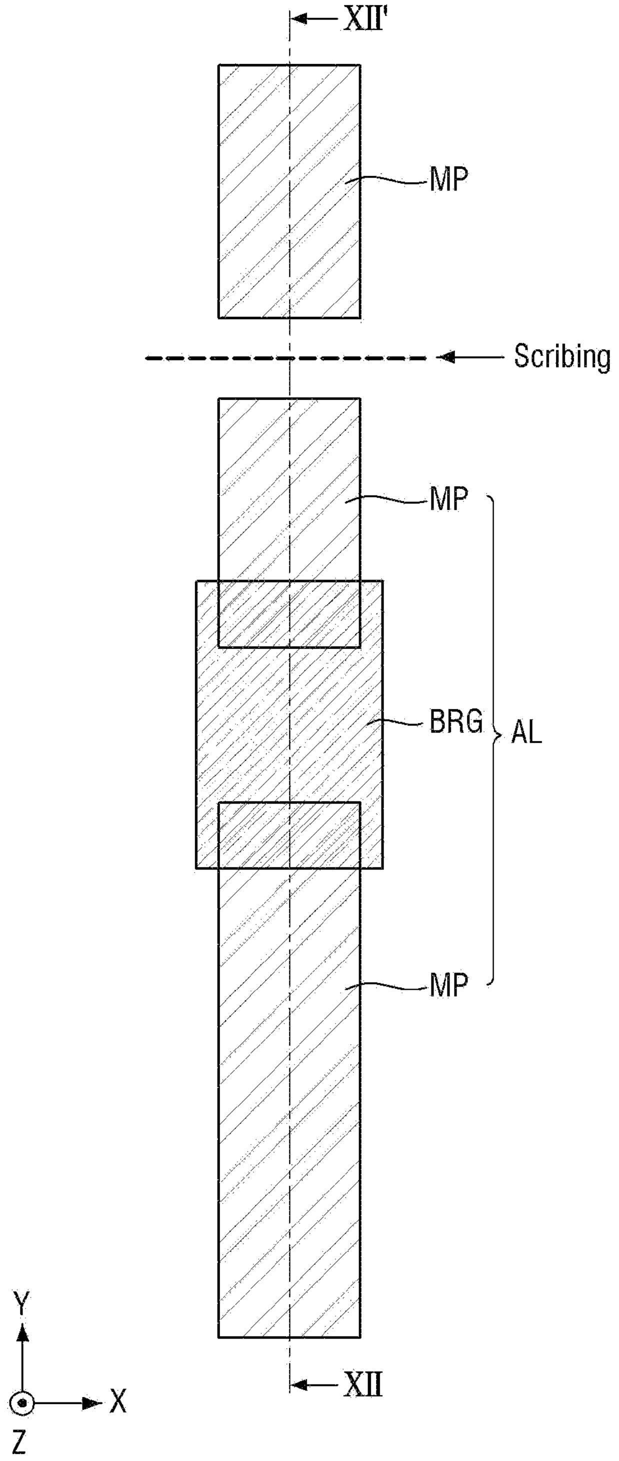
FIG. 37 is a plan view showing an alignment line of a display device according to still another embodiment.
Figure 38:
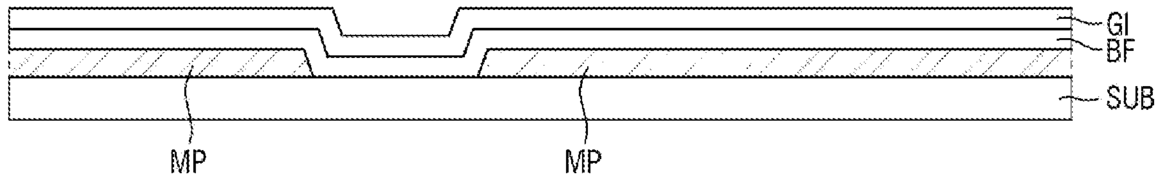
FIGS. 38 to 41 are schematic cross-sectional views showing a manufacturing process of the alignment line of FIG. 37.
Figure 39:
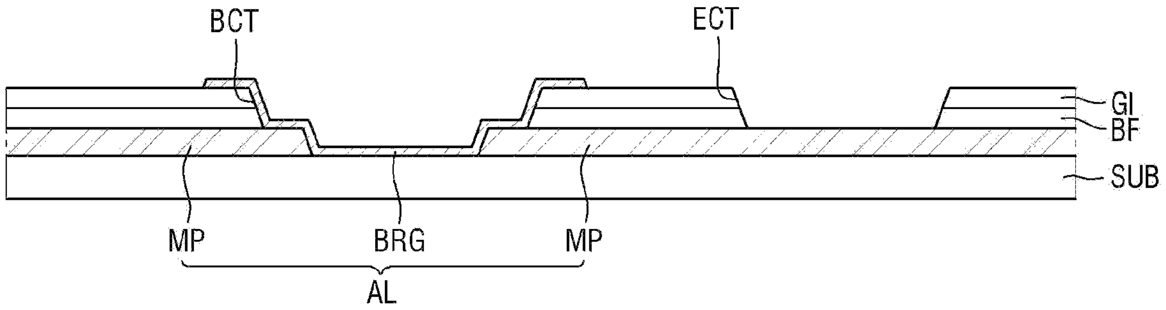
Figure 40:
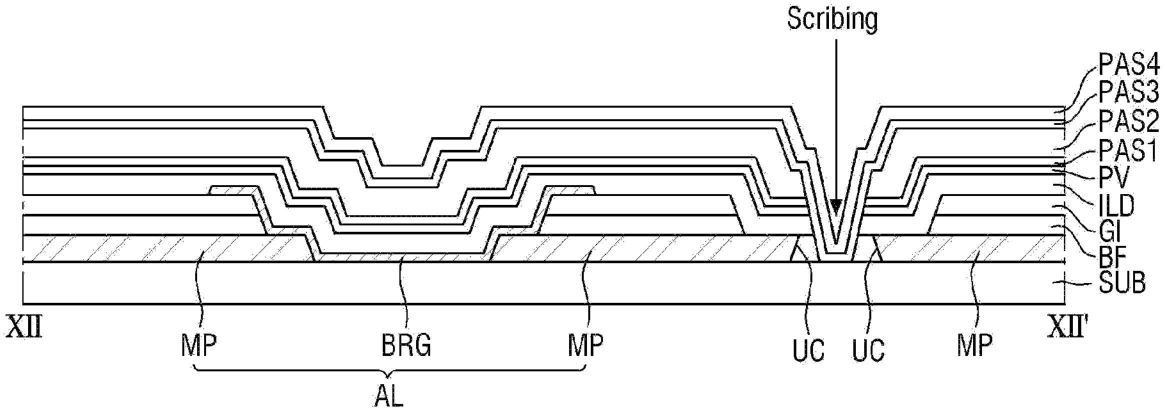

FIG. 37 is a plan view showing an alignment line of a display device according to still another embodiment, and FIGS. 38 to 41 are schematic cross-sectional views showing a manufacturing process of the alignment line of FIG. 37. FIG. 40 is a schematic cross-sectional view taken along line XII-XII' of FIG. 37.

Referring to FIGS. 37 to 41, the alignment line AL may be disposed in the non-display area NDA. The alignment line AL may supply an alignment signal to the first to third electrodes RME1, RME2, and RME3 during the alignment process of the light emitting elements ED. The alignment line AL may include a metal pattern MP and a bridge portion BRG.

In FIG. 38, the metal pattern MP may be disposed on the substrate SUB. The metal pattern MP may be formed of a same material as the first metal layer MTL1 of the display area DA on a same layer as the first metal layer MTL1. The buffer layer BF and the gate insulating layer GI may be sequentially stacked each other on the metal pattern MP and the substrate SUB. For example, each of the buffer layer BF and the gate insulating layer GI may include at least one inorganic layer or at least one organic layer.

In FIG. 39, each of the bridge contact hole BCT and the edge etching portion ECT may be formed to penetrate the gate insulating layer GI and the buffer layer BF. The gate insulating layer GI and the buffer layer BF may be etched through a dry etching process or a wet etching process, but are not limited thereto. The bridge contact hole BCT may overlap the etched portion of the metal pattern MP. Accordingly, the etched portion of the metal pattern MP may be exposed by the bridge contact hole BCT. The edge etching portion ACT may be formed in a region in which a scribing process is to be performed. The metal pattern MP may be exposed by the edge etching portion ACT.

The bridge portion BRG may be disposed on the gate insulating layer GI, and may be disposed in the bridge contact hole BCT that electrically connects the bridge portion BRG with the metal patterns MPs spaced apart from each other. The bridge portion BRG may be formed of a same material as the second metal layer MTL2 of the display area DA on a same layer as the second metal layer MTL2. For example, the bridge portion BRG may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The alignment line AL may be electrically connected to the first to third electrodes RME1, RME2, and RME3 of the display area DA. The alignment line AL may receive an alignment signal from the outside during the manufacturing process of the display device 10 and supply it to the first to third electrodes RME1, RME2, and RME3. The first to third electrodes RME1, RME2, and RME3 may receive the alignment signal, and an electric field may be formed between the first to third electrodes RME1, RME2, and RME3. The light emitting elements ED may be injected onto the first to third electrodes RME1, RME2, and RME3 through an inkjet printing process. The injected light emitting elements ED may be aligned by receiving a dielectrophoretic force exerted by the electric field formed between the first to third electrodes RME1, RME2, and RME3.

In FIG. 40, the interlayer insulating layer ILD, the passivation layer PV, the first and second insulating layers PAS1 and PAS2 may be sequentially stacked each other on the bridge portion BRG and the gate insulating layer GI. For example, each of the interlayer insulating layer ILD, the passivation layer PV, and the first and second insulating layers PAS1 and PAS2 may include at least one inorganic layer or at least one organic layer.

After the completion of the alignment process of the light emitting elements ED, the first and second insulating layers PAS1 and PAS2, the passivation layer PV, the interlayer insulating layer ILD, and the metal pattern MP may be etched. For example, the first and second insulating layers PAS1 and PAS2, the passivation layer PV, and the interlayer insulating layer ILD may be etched through a dry etching process, and the metal pattern MP may be etched through a wet etching process, but are not limited thereto.

The metal pattern MP may be etched in a region overlapping the edge etching portion ACT. In case that the metal pattern MP is etched through a wet etching process, the metal pattern MP may include the undercut UC. The etching area of the metal pattern MP may be larger than the etching area of the first and second insulating layers PAS1 and PAS2, and the lower portion of the metal pattern MP may be etched more than the upper portion of the metal pattern MP due to the undercut UC.

The third insulating layer PAS3 and a fourth insulating layer PAS4 may be sequentially stacked each other on the second insulating layer PAS2 and the substrate SUB. For example, each of the third and fourth insulating layers PAS3 and PAS4 may include at least one inorganic layer or at least one organic layer. The third and fourth insulating layers PAS3 and PAS4 may cover the top surface of the substrate SUB that is exposed as a result of the metal pattern MP being etched. The third insulating layer PAS3 may be spaced apart from the metal pattern MP due to the undercut UC of the metal pattern MP. Therefore, an empty space surrounded by the substrate SUB, the metal pattern MP, the interlayer insulating layer ILD, and the third insulating layer PAS3 may be formed.

Figure 41:
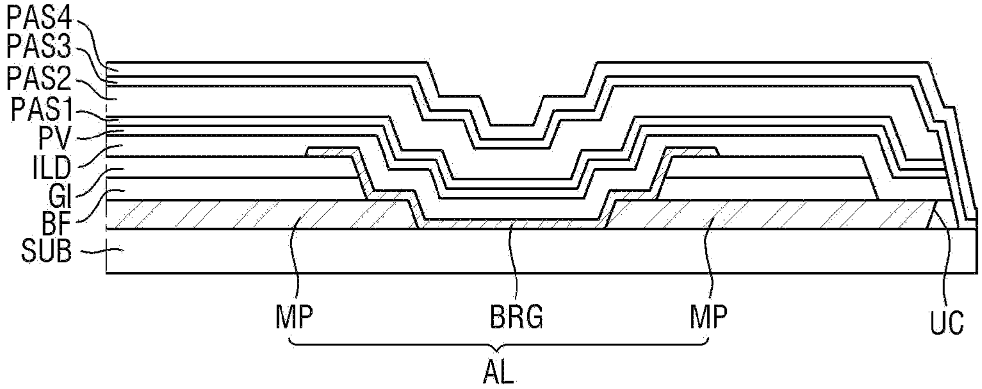

In FIG. 41, the substrate SUB, and the third and fourth insulating layers PAS3 and PAS4 may be cut by a scribing process. The size of the display panel 100 may be determined through the scribing process and a grinding process. A schematic cross-sectional view of FIG. 41 may correspond to yet another example of the cross section of the non-display area NDA of FIG. 2.

The display device 10 includes the bridge portion BRG serving to electrically connect the metal patterns MP, so that corrosion of the alignment line AL can be blocked or prevented even in case that the undercut UC of the metal pattern MP occurs at the edge of the display panel 100. The bridge portion BRG may be disposed in the bridge contact hole BCT that electrically connects the bridge portion BRG with the metal pattern MP. The contact structure through the bridge contact hole BCT may prevent permeation and diffusion of moisture, and may block or prevent corrosion of the alignment line AL.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a thin film transistor layer comprising a first metal layer disposed on a substrate and a thin film transistor disposed on the first metal layer;
first and second electrodes disposed in a display area on the thin film transistor layer and extending in parallel in a direction;
a plurality of light emitting elements disposed between the first and second electrodes; and
an alignment line disposed in a non-display area disposed adjacent to the display area and electrically connected to the first and second electrodes,
wherein the alignment line comprises:
metal patterns disposed in the first metal layer and spaced apart from each other; and
a cover portion disposed on the first metal layer and electrically connected to and covering an end of at least one of the metal patterns by extending from a same layer as the first metal layer to a layer above the first metal layer.

2. The display device of claim 1, wherein the thin film transistor layer comprises:
an active layer on which an active region, a drain electrode, and a source electrode of the thin film transistor are disposed;
a second metal layer in which a gate electrode of the thin film transistor is disposed; and
a third metal layer disposed on the second metal layer, and
the first and second electrodes are disposed in a fourth metal layer on the thin film transistor layer.

3. The display device of claim 2, wherein the cover portion and the fourth metal layer are formed of a same material on a same layer.

4. The display device of claim 3, wherein the spaced apart metal patterns are insulated from each other.

5. The display device of claim 3, wherein the cover portion electrically connects the spaced apart metal patterns.

6. The display device of claim 3, wherein the metal patterns include an undercut formed at an edge of the substrate.

7. The display device of claim 3, wherein the metal patterns are exposed from a side of the substrate.

8. The display device of claim 3, further comprising:
an insulating layer disposed on the alignment line,
wherein the insulating layer covers top surfaces and side surfaces of the metal patterns at an edge of the substrate.

9. The display device of claim 3, further comprising:
a buffer layer covering the first metal layer;
a gate insulating layer covering the active layer;

an interlayer insulating layer covering the second metal layer; and a passivation layer covering the third metal layer, wherein the cover portion is disposed in a contact hole, the contact hole penetrating the passivation layer, the interlayer insulating layer, the gate insulating layer, and the buffer layer, and wherein the cover portion and the at least one of the metal patterns are electrically connected to each other in the contact hole.

10. The display device of claim 2, wherein the cover portion and the third metal layer are formed of a same material on a same layer.

11. The display device of claim 10, further comprising:

a buffer layer covering the first metal layer;

a gate insulating layer covering the active layer; and an interlayer insulating layer covering the second metal layer, wherein the cover portion is disposed in a contact hole, the contact hole penetrating the interlayer insulating layer, the gate insulating layer, and the buffer layer, and wherein the cover portion and the at least one of the metal patterns are electrically connected to each other in the contact hole.

12. The display device of claim 2, wherein the cover portion and the second metal layer are formed of a same material on a same layer.

13. The display device of claim 12, further comprising:

a buffer layer covering the first metal layer; and a gate insulating layer covering the active layer, wherein the cover portion is disposed in a contact hole, the contact hole penetrating the gate insulating layer and the buffer layer, and wherein the cover portion and the at least one of the metal patterns are electrically connected to each other in the contact hole.

14. The display device of claim 2, further comprising:

a first contact electrode disposed in a fifth metal layer on the fourth metal layer and electrically connected between the first electrode and the plurality of light emitting elements; and a second contact electrode disposed in the fifth metal layer and electrically connected between the second electrode and the plurality of light emitting elements.

15. A display device comprising:

a first metal layer disposed on a substrate;

a thin film transistor disposed on the first metal layer;

an active layer on which an active region, a drain electrode, and a source electrode of the thin film transistor are disposed;

a second metal layer in which a gate electrode of the thin film transistor is disposed;

a third metal layer disposed on the second metal layer;

a fourth metal layer disposed in a display area on the third metal layer and comprising first and second electrodes extending in parallel in a direction;

a plurality of light emitting elements disposed between the first and second electrodes; and an alignment line disposed in a non-display area disposed adjacent to the display area and electrically connected to the first and second electrodes, wherein the alignment line comprises:

a metal pattern disposed in the first metal layer;

a first cover portion disposed in the third metal layer and electrically connected to the metal pattern; and a second cover portion disposed in the fourth metal layer and electrically connected to the first cover portion.

16. The display device of claim 15, further comprising:

a buffer layer covering the first metal layer;

a gate insulating layer covering the active layer;

an interlayer insulating layer covering the second metal layer; and a passivation layer covering the third metal layer, wherein the first cover portion is disposed in a first contact hole, the first contact hole penetrating the interlayer insulating layer, the gate insulating layer, and the buffer layer, and wherein the first cover portion and the metal pattern are electrically connected to each other in the first contact hole.

17. The display device of claim 16, wherein the second cover portion is disposed in a second contact hole, the second contact hole penetrating the passivation layer, and wherein the second cover portion and the first cover portion are electrically connected to each other in the second contact hole.

* * * * *